(12) United States Patent
Pynn et al.

(10) Patent No.: US 11,195,973 B1
(45) Date of Patent: Dec. 7, 2021

(54) III-NITRIDE MICRO-LEDS ON SEMI-POLAR ORIENTED GAN

(71) Applicant: Facebook Technologies, LLC, Menlo Park, CA (US)

(72) Inventors: Christopher Pynn, Cork (IE); Anneli Munkholm, Redmond, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/415,769

(22) Filed: May 17, 2019

(51) Int. Cl.
| | |
|---|---|
| *H01L 33/32* | (2010.01) |
| *H01L 33/24* | (2010.01) |
| *H01L 33/06* | (2010.01) |
| *H01L 33/14* | (2010.01) |
| *H01L 33/12* | (2010.01) |
| *G02B 27/01* | (2006.01) |
| *G09F 9/33* | (2006.01) |
| *H01L 33/46* | (2010.01) |
| *H01L 33/00* | (2010.01) |

(52) U.S. Cl.
CPC .......... *H01L 33/32* (2013.01); *G02B 27/0172* (2013.01); *G09F 9/33* (2013.01); *H01L 33/0075* (2013.01); *H01L 33/06* (2013.01); *H01L 33/12* (2013.01); *H01L 33/145* (2013.01); *H01L 33/24* (2013.01); *H01L 33/46* (2013.01); *G02B 2027/0178* (2013.01); *H01L 2933/0025* (2013.01)

(58) Field of Classification Search
CPC ............. H01L 33/0025; H01L 33/0062; H01L 33/0066; H01L 33/007; H01L 33/0075; H01L 33/04; H01L 33/06; H01L 33/14; H01L 33/16; H01L 33/18; H01L 33/20; H01L 33/26; H01L 33/30; H01L 33/305; H01L 33/32
See application file for complete search history.

(56) References Cited

U.S. PATENT DOCUMENTS

| | | | |
|---|---|---|---|
| 8,247,887 B1 * | 8/2012 | Raring | H01L 33/16 257/628 |
| 9,412,911 B2 | 8/2016 | Atanackovic et al. | |
| 1,010,807 A1 | 10/2018 | Raring et al. | |
| 10,403,678 B2 * | 9/2019 | Percival | H01L 33/20 |

(Continued)

OTHER PUBLICATIONS

Olivier et al., "Influence of size-reduction on the performances of GaN-based micro-LEDs for display application", Journal of Luminescence 191, 2017, 5 pages.

(Continued)

*Primary Examiner* — Maliheh Malek
(74) *Attorney, Agent, or Firm* — Weaver Austin Villeneuve & Sampson LLP

(57) ABSTRACT

Disclosed herein are techniques for improving the light emitting efficiency of micro light emitting diodes. According to certain embodiments, micro-LEDs having small physical dimensions are fabricated on III-nitride materials with semi-polar crystal lattice orientations to reduce the surface recombination of excess charge carriers that does not generate photons and to reduce the polarization induced internal field that may cause energy band shift and aggravate the Quantum-Confined Stark Effect, thereby increasing the peak quantum efficiencies and/or reducing the peak efficiency current density of the micro-LEDs.

20 Claims, 16 Drawing Sheets

(56) References Cited

U.S. PATENT DOCUMENTS

| | | | |
|---|---|---|---|
| 10,468,552 B2* | 11/2019 | Lutgen | H01L 33/06 |
| 10,573,781 B1* | 2/2020 | Munkholm | H01L 33/007 |
| 10,593,834 B2* | 3/2020 | Wu | H01L 25/0753 |
| 10,923,630 B1* | 2/2021 | Pynn | H01L 33/32 438/46 |
| 11,030,820 B1* | 6/2021 | Inversin | G02B 27/017 |
| 2008/0179623 A1* | 7/2008 | Tachibana | H01L 33/32 257/103 |
| 2008/0230766 A1* | 9/2008 | Okamoto | H01L 33/08 257/13 |
| 2008/0232416 A1* | 9/2008 | Okamoto | H01S 5/34333 372/45.01 |
| 2009/0166608 A1* | 7/2009 | Nakanishi | H01L 33/22 257/13 |
| 2009/0194761 A1* | 8/2009 | Masui | H01L 33/34 257/13 |
| 2009/0279278 A1* | 11/2009 | Tsujimura | F21V 19/00 362/19 |
| 2009/0296765 A1* | 12/2009 | Takayama | B82Y 20/00 372/45.01 |
| 2011/0073888 A1* | 3/2011 | Ueno | H01L 33/32 257/94 |
| 2011/0179993 A1* | 7/2011 | Inoue | C30B 29/403 117/94 |
| 2011/0216795 A1* | 9/2011 | Hsu | H01L 21/0254 372/44.011 |
| 2011/0220866 A1* | 9/2011 | Xu | H01L 33/24 257/13 |
| 2012/0049156 A1* | 3/2012 | Ohta | H01L 21/0237 257/13 |
| 2012/0058577 A1* | 3/2012 | Yoshida | H01L 33/0075 438/14 |
| 2012/0113656 A1* | 5/2012 | Iwanaga | H01L 33/16 362/382 |
| 2012/0119218 A1* | 5/2012 | Su | C30B 25/18 257/76 |
| 2012/0205620 A1* | 8/2012 | Sato | H01L 33/32 257/13 |
| 2012/0211725 A1* | 8/2012 | Yokogawa | H01L 21/02609 257/13 |
| 2013/0001513 A1* | 1/2013 | Yokogawa | H01L 21/02458 257/13 |
| 2013/0044782 A1* | 2/2013 | Raring | H01S 5/0202 372/45.012 |
| 2013/0049569 A1* | 2/2013 | Schubert | H01L 33/502 313/483 |
| 2013/0126900 A1* | 5/2013 | Inoue | H01L 33/32 257/76 |
| 2013/0146928 A1* | 6/2013 | Inoue | H01L 33/32 257/98 |
| 2013/0156060 A1* | 6/2013 | Futagawa | B82Y 20/00 372/45.01 |
| 2013/0168733 A1* | 7/2013 | Iwanaga | H01L 21/0242 257/190 |
| 2013/0175566 A1* | 7/2013 | Inoue | H01L 33/18 257/98 |
| 2013/0200391 A1* | 8/2013 | Bedair | H01L 33/16 257/76 |
| 2013/0207150 A1* | 8/2013 | Inoue | H01L 33/50 257/98 |
| 2013/0234110 A1* | 9/2013 | Kato | H01L 33/025 257/13 |
| 2013/0248877 A1* | 9/2013 | Fujikane | H01L 33/58 257/76 |
| 2014/0008613 A1* | 1/2014 | Sheu | H01L 33/04 257/17 |
| 2014/0014997 A1* | 1/2014 | Kato | H01L 33/32 257/98 |
| 2014/0048771 A1* | 2/2014 | Takahashi | H01L 21/02507 257/13 |
| 2014/0065360 A1* | 3/2014 | D'Evelyn | C30B 25/18 428/141 |
| 2014/0077223 A1* | 3/2014 | Choe | H01L 21/20 257/76 |
| 2014/0103292 A1* | 4/2014 | Yoshida | H01L 21/02609 257/13 |
| 2014/0264372 A1* | 9/2014 | Fujikane | H01L 33/405 257/76 |
| 2014/0308769 A1* | 10/2014 | Farrell | H01L 21/0262 438/46 |
| 2014/0332933 A1* | 11/2014 | Li | H01L 33/16 257/623 |
| 2014/0349427 A1* | 11/2014 | El-Ghoroury | H01L 33/08 438/31 |
| 2014/0353679 A1* | 12/2014 | Seo | H01L 33/42 257/76 |
| 2015/0187991 A1* | 7/2015 | McGroddy | H01L 33/30 257/13 |
| 2015/0200286 A1* | 7/2015 | Liu | H01L 29/66462 257/194 |
| 2015/0229108 A1* | 8/2015 | Steigerwald | H01S 5/4031 372/45.01 |
| 2015/0236201 A1* | 8/2015 | Shepherd | H01L 33/0075 257/88 |
| 2015/0263223 A1* | 9/2015 | Ito | H01L 33/382 257/103 |
| 2015/0270440 A1* | 9/2015 | Kimura | H01L 33/18 257/101 |
| 2015/0311068 A1* | 10/2015 | Tsukada | H01L 29/32 438/492 |
| 2015/0325746 A1* | 11/2015 | Percival | H01L 27/15 257/76 |
| 2015/0357521 A1* | 12/2015 | Choe | H01L 33/32 257/103 |
| 2016/0013364 A1* | 1/2016 | Cha | H01L 33/24 438/34 |
| 2017/0069790 A1* | 3/2017 | Choi | H01L 33/16 |
| 2017/0170360 A1* | 6/2017 | Bour | H01L 33/305 |
| 2017/0236704 A1* | 8/2017 | Dasgupta | H01L 21/02381 257/76 |
| 2017/0362739 A1* | 12/2017 | Kajimoto | C30B 29/406 |
| 2018/0047782 A1* | 2/2018 | Percival | H01L 27/156 |
| 2018/0145164 A1* | 5/2018 | Dasgupta | H01L 21/02458 |
| 2018/0156965 A1* | 6/2018 | El-Ghoroury | H01L 27/156 |
| 2018/0158987 A1* | 6/2018 | Lee | H01L 27/1251 |
| 2019/0305183 A1* | 10/2019 | Lutgen | H01L 33/46 |
| 2019/0341521 A1* | 11/2019 | Lutgen | H01L 33/16 |
| 2020/0028029 A1* | 1/2020 | Avramescu | H01L 33/0066 |
| 2020/0083400 A1* | 3/2020 | Henry | H01L 33/24 |
| 2020/0105968 A1* | 4/2020 | Lutgen | H01L 33/20 |
| 2020/0168146 A1* | 5/2020 | Hughes | G09G 3/2088 |
| 2020/0176634 A1* | 6/2020 | Batres | H01L 33/0075 |
| 2020/0176637 A1* | 6/2020 | Wu | H01L 33/20 |
| 2020/0184884 A1* | 6/2020 | Lau | H01L 33/502 |
| 2020/0244036 A1* | 7/2020 | Forman | H01S 5/02272 |
| 2020/0395521 A1* | 12/2020 | Brodoceanu | H01L 33/62 |
| 2021/0191180 A1* | 6/2021 | Malhotra | C08L 67/00 |

OTHER PUBLICATIONS

Browne et al., "Indium and impurity incorporation in InGaN films on polar, nonpolar, and semipolar GaN orientations grown by ammonia molecular beam epitaxy", J. Vac. Sci. Technol. A 30(4), American Vacuum Society, 2012, 8 pages.

Forman et al., "Semipolar (2021) III-Nitride P-Down LEDs with in situ anneal to reduce the Mg memory effect", Journal of Crystal Growth 464, 2017, 4 pages.

Romanov et al., "Basal plane misfit dislocations and stress relaxation in III-nitride semipolar heteroepitaxy", Journal of Applied Physics 109, 2011, 12 pages.

Zhao et al., "Valence band states and polarized optical emission from nonpolar and semipolar III-nitride quantum well optoelectronic devices", Japanese Journal of Applied Physics 53, 2014, 17 pages.

U.S. Notice of Allowance dated Dec. 23, 2020 in U.S. Appl. No. 16/539,940.

Fellows, et al., "Increased Polarization Ratio on Semipolar (1122) InGaN/GaN Light-Emitting Diodes with Increasing Indium Com-

(56) References Cited

OTHER PUBLICATIONS position", Japanese Journal of Applied Physics, vol. 47, No. 10, 2008, pp. 7854-7856.

Koslow, et al., "Performance and polarization effects in (1122) long wavelength light emitting diodes grown on stress relaxed InGaN buffer layers", Applied Physics Letters 101, 121106 (2012), 4 pages.

Mounir, et al., "On the optical polarization properties of semipolar (2021) and (2021) InGaN/GaN quantum wells", Journal of Applied Physics 123, 085705 (2018), 11 pages.

Zhao, et al., "High optical polarization ratio from semipolar (2021) blue-green InGaN/GaN light-emitting diodes", Applied Physics Letters 99, 051109 (2011), 3 pages.

Zhao, et al., "Optical polarization characteristics of semipolar (3031) and (3031) InGaN/GaN light-emitting diodes", Optics Express A54, vol. 21, No. S1, Jan. 14, 2013, 7 pages.

Notice of Allowance dated Apr. 9, 2021, in U.S. Appl. No. 16/539,940.

\* cited by examiner

III-NITRIDE MICRO-LEDS ON SEMI-POLAR ORIENTED GAN

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, and wearable electronic devices. Micro-LEDs ("µLEDs") based on III-nitride semiconductors, such as alloys of AlN, GaN, InN, and the like, have begun to be developed for various display applications due to their small size (e.g., with a linear dimension less than 100 µm, less than 50 µm, or less than 10 µm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro light emitting diodes (micro-LEDs) having improved light emission efficiency. More specifically, this disclosure relates to micro-LEDs fabricated on III-nitride materials with semi-polar crystal lattice orientations to increase the peak quantum efficiencies of the micro-LEDs and/or to reduce the peak efficiency current density of the micro-LEDs by, for example, reducing the surface recombination of excess charge carriers that does not generate photons and reducing the polarization induced internal field that may cause energy band shift and aggravate the Quantum-Confined Stark Effect (QCSE).

According to some embodiments, a micro-LED includes a substrate that includes a hexagonal lattice and has a first surface parallel to a semi-polar plane of the hexagonal lattice. The micro-LED may also include a mesa on the first surface of the substrate. The mesa may include a sidewall and an active layer that includes a III-nitride material. The active layer may include a side surface forming part of the sidewall of the mesa, and a bottom surface parallel to the semi-polar plane of the hexagonal lattice such that non-radiative surface recombination at the side surface of the active layer may be reduced compared with a substitute active layer that includes the III-nitride material but has a surface parallel to a c-plane of the hexagonal lattice.

In some embodiments of the micro-LED, the bottom surface of the active layer in the mesa may be characterized by a linear dimension less than 20 µm. In some embodiments, the peak efficiency current density of the micro-LED may be less than 1 A/cm'. In some embodiments, a blue-shift of the micro light emitting diode is less than 15 nm/decade with the increase of the current density of the micro-LED. In some embodiments, the angle between the semi-polar plane and the c-plane of the hexagonal lattice is between 0° and 90°, or between 45° and 90°. In some embodiments, the semi-polar plane includes a $(20\bar{2}1)$ plane of the hexagonal lattice.

In some embodiments of the micro-LED, the active layer is characterized by a first Shockley-Read-Hall (SRH) recombination rate in a region of the active layer adjacent to the side surface of the active layer. The first SRH recombination rate may be lower than a second SRH recombination rate, where the second SRH recombination rate corresponds to an SRH recombination rate in the region of the active layer adjacent to the side surface of the active layer when the bottom surface of the active layer is parallel to the c-plane of the hexagonal lattice. In some embodiments, the region of the active layer adjacent to the side surface of the active layer is within a minority carrier diffusion length from the side surface of the active layer.

In some embodiments, the micro-LED may also include a passivation layer on the sidewall of the mesa, where the active layer may be configured to emit photons through radiative recombination of electrons and holes in the active layer and the passivation layer may be configured to reflect the photons emitted by the active layer. In some embodiments, at least a portion of the passivation layer may include a omnidirectional reflector. In some embodiments, the micro-LED may include a buffer layer between the substrate and the mesa. In some embodiments, the mesa may also include an electron-blocking layer coupled to the active layer.

In some embodiments, the substrate may include GaN, GaAs, GaP, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure. In some embodiments, the active layer includes an InGaN multiple-quantum-well (MQW).

According to certain embodiments, a display device may include a substrate including a hexagonal lattice and a first surface parallel to a semi-polar plane of the hexagonal lattice. The display device may include an array of mesas on the first surface of the substrate. Each mesa may include a sidewall and an active layer that includes a III-nitride material. The active layer may include a side surface that forms part of the sidewall of the mesa, and a bottom surface parallel to the semi-polar plane of the hexagonal lattice such that non-radiative surface recombination at the side surface of the active layer is reduced compared with a substitute active layer that includes the III-nitride material but has a surface parallel to a c-plane of the hexagonal lattice.

In certain embodiments of the display device, the bottom surface of the active layer in the mesa is characterized by a linear dimension less than 20 µm. In some embodiments, an angle between the semi-polar plane and the c-plane of the hexagonal lattice is between 0° and 90° or between 60° and 90°. In some embodiments, the display device may also include a passivation layer on the sidewall of each mesa in the array of mesas, where the passivation layer may be configured to reflect photons emitted by the active layer.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
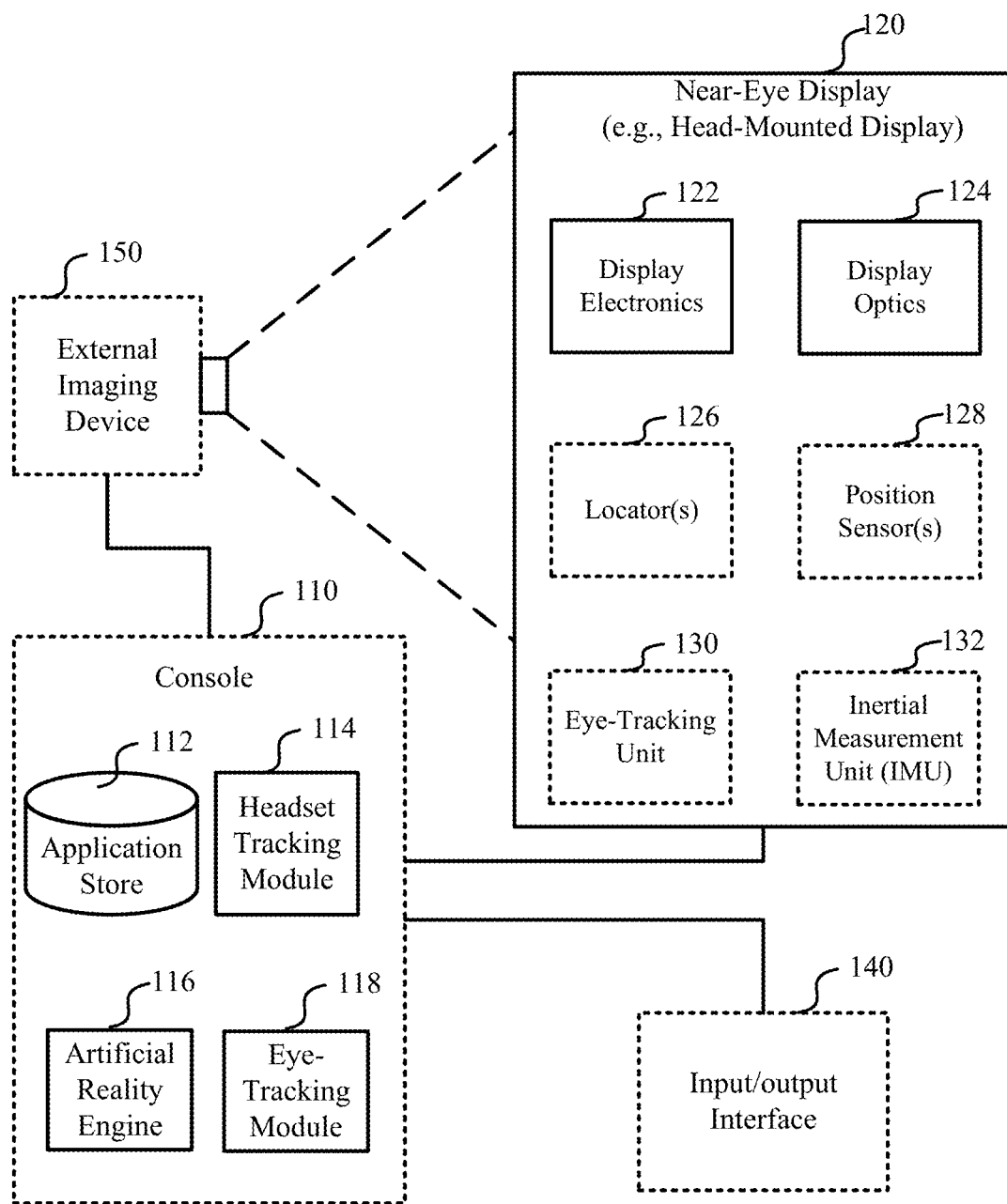
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diodes (LEDs). More specifically, and without limitation, disclosed herein are techniques for improving the quantum efficiencies of III-nitride micro-LEDs. According to certain embodiments, micro-LEDs are fabricated on III-nitride materials (e.g., AlN, GaN, or InN) with certain semi-polar crystal lattice orientations to increase the quantum efficiencies of the micro-LEDs by, for example, reducing surface recombination of excess charge carriers that does not generate photons and/or reducing internal field that may aggravate the Quantum-Confined Stark Effect (QCSE). Various inventive embodiments are described herein, including devices, systems, methods, materials, and the like.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device. For LEDs, and in particular, micro-LEDs with reduced physical dimensions, improving the internal and external quantum efficiency and/or controlling the emission spectrum may be challenging.

The quantum efficiency of III-nitride (e.g., GaN) LEDs depends on the relative rates of competitive radiative (light producing) recombination and non-radiative (lossy) recombination that occur in the active region of the LEDs. Non-radiative recombination processes in the active region include Shockley-Read-Hall (SRH) recombination at defect sites and eeh/ehh Auger recombination. In micro-LEDs, as the size of an LED is reduced and becomes comparable to the minority carrier diffusion length, a larger proportion of the total active region is close to the LED sidewall surface where the defect density may be high, and thus more injected carriers are subjected to a higher SRH recombination rate. This may cause the peak efficiency of the LED to decrease or cause the peak efficiency operating current to increase. Increasing the current injection may cause the efficiencies of the micro-LEDs to drop due to eeh or ehh Auger recombination at a higher current density, which is a non-radiative process involving three carriers.

In addition, LEDs including heterostructures (e.g., quantum wells) formed using these III-nitride materials may have a strong internal strain-induced piezoelectric field in the carrier transport direction. The strain-induced internal field may cause the electron and hole energy levels to shift (thus changing the bandgap) and cause the electrons and holes to shift to opposite sides of a quantum well (i.e., decreasing the spatial electron-hole overlap), thus reducing the recombination efficiency of the LEDs.

According to certain embodiments, micro-LEDs fabricated on III-nitride materials (e.g., GaN) having certain crystal orientations can achieve a better efficiency performance than micro-LED devices fabricated on III-nitride materials with conventional (e.g., c-plane) orientations. More specifically, for micro-LEDs fabricated on III-nitride materials with certain semi-polar orientations (between the polar c-plane and non-polar a- and m-planes), such as semi-polar planes that are at angles between 0° and 90° (e.g., between about 45° and about 90° or between about 60° and about 90°, such as 75°) with respect to the c-plane, the (peak) quantum efficiency of the micro-LEDs does not drop with decreasing micro-LED size, and the current density at the peak quantum efficiency does not increase with decreasing micro-LED size. For example, the peak quantum efficiency of micro-LEDs fabricated on GaN epitaxial layers grown on $(20\bar{2}1)$ plane does not drop with decreasing micro-LED size. Experimental results show that using GaN epitaxial layers having certain semi-polar orientations (e.g., $(20\bar{2}1)$ plane) can result in a sustained peak quantum efficiency and a sustained low (~1 A/cm$^2$) peak efficiency current density as the micro-LED size decreases.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using LED-based display subsystem.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, or even 2 μm. Some micro-LEDs may have a linear dimension (e.g., length or diameter) comparable to the minority carrier diffusion length. However, the disclosure herein is not limited to micro-LEDs, and may also be applied to mini-LEDs and large LEDs.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

I. Artificial Reality Systems

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140 that may each be coupled to an optional console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audios may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
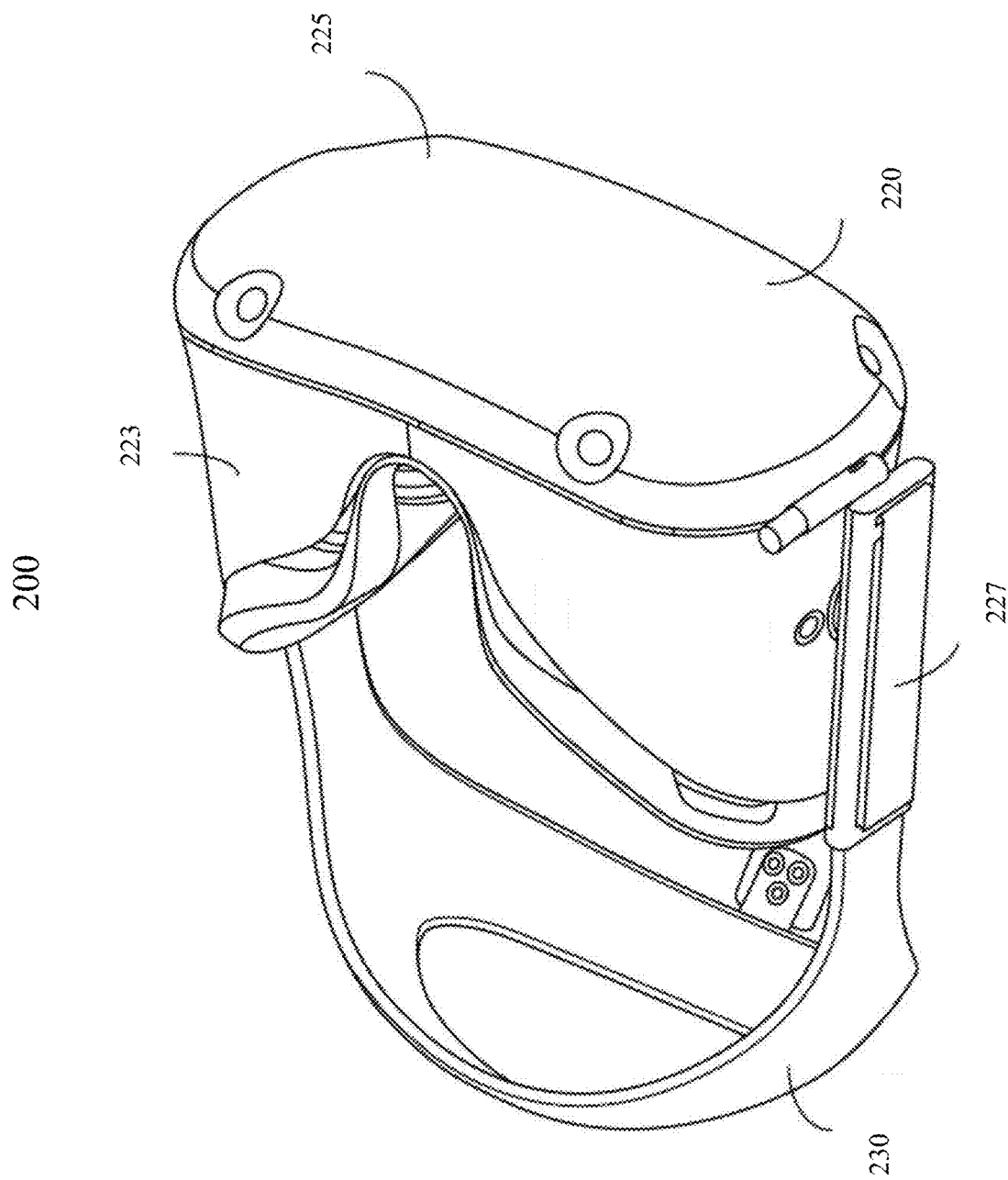
FIG. 2 is a perspective view of an example of a near-eye display in the form of a head-mounted display (HMD) device for implementing some of the examples disclosed herein.

FIG. 2 is a perspective view of an example of a near-eye display in the form of a head-mounted display (HMD) device 200 for implementing some of the examples disclosed herein. HMD device 200 may be a part of, e.g., a virtual reality (VR) system, an augmented reality (AR) system, a mixed reality (MR) system, or some combinations thereof. HMD device 200 may include a body 220 and a head strap 230. FIG. 2 shows a top side 223, a front side 225, and a right side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temples tips as shown in, for example, FIG. 2, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audios, or some combinations thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, a liquid crystal display (LCD), an organic light emitting diode (OLED) display, an inorganic light emitting diode (ILED) display, a micro light emitting diode (µLED) display, an active-matrix organic light emitting diode (AMOLED) display, a transparent organic light emitting diode (TOLED) display, some other display, or some combinations thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or some combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
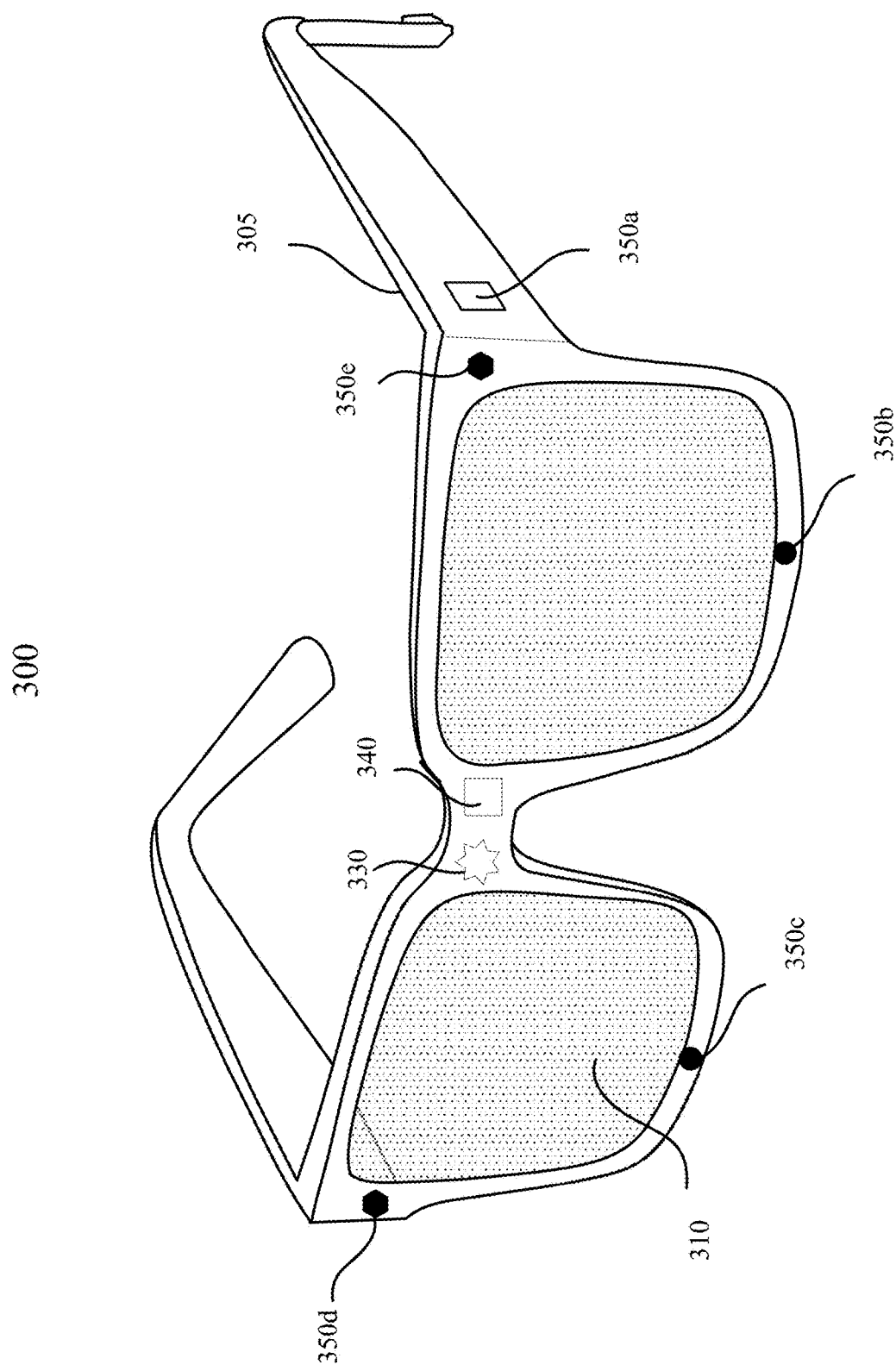
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

II. Micro-LEDs

The light sources or displays described above may include one or more LEDs. For example, each pixel in a display may include three subpixels that include a red micro-LED, a green micro-LED, and a blue micro-LED. A semiconductor light emitting diode generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active layer that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Figure 4A:
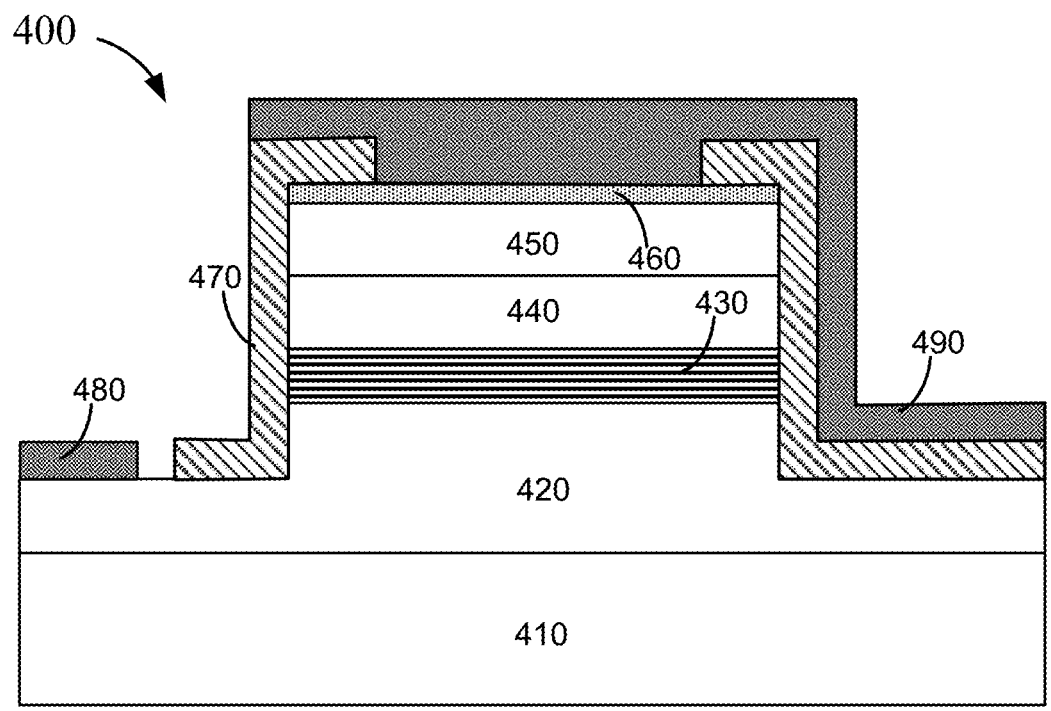
FIG. 4A illustrates an example of a light emitting diode (LED) including a vertical mesa structure according to certain embodiments.

FIG. 4A illustrates an example of a light emitting diode 400 including a vertical mesa structure. LED 400 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques, such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation, such as a GaN, GaAs, or GaP substrate, or a foreign substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 4A, LED 400 may include a substrate 410, which may include, for example, a sapphire substrate or a GaN substrate. A semiconductor layer 420 may be grown on substrate 410. Semiconductor layer 420 may include a III-V material, such as GaN, and may be p-doped (e.g., with Mg, Ca, Zn, or Be) or n-doped (e.g., with Si or Ge). One or more active layers 430 may be grown on semiconductor layer 420. Active layers 430 may include one or more InGaN layers, one or more AlInGaP layers, or one or more GaN layers, which may form one or more heterostructures, such as one or more quantum wells. A semiconductor layer 440 may be grown on active layers 430. Semiconductor layer 440 may include a III-V material, such as GaN, and may be p-doped (e.g., with Mg, Ca, Zn, or Be) or n-doped (e.g., with Si or Ge). One of semiconductor layer 420 and semiconductor layer 440 may be a p-type layer and the other one may be an n-type layer. Semiconductor layer 420 and semiconductor layer 440 sandwich active layers 430 to form the light emitting diode. For example, LED 400 may include a layer of InGaN situated between a layer of p-type GaN doped with magnesium and a layer of n-type GaN doped with silicon or oxygen. In some embodiments, LED 400 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 4A) may be grown to form a layer between active layers 430 and at least one of semiconductor layer 420 or semiconductor layer 440. The EBL may reduce the electron leakage current and improve the efficiency of the LED. In some embodiments, a heavily-doped semiconductor layer 450, such as a P$^+$ or P$^{++}$ semiconductor layer, may be formed on semiconductor layer 440 and act as a contact layer for forming an ohmic contact and reducing the contact impedance of the device. In some embodiments, a conductive layer 460 may be formed on heavily-doped semiconductor layer 450. Conductive layer 460 may include, for example, an indium tin oxide (ITO) or Al/Ni/Au film. In one example, conductive layer 460 may include a transparent ITO layer.

To make contact with semiconductor layer 420 (e.g., an n-GaN layer) of the diode and to more efficiently extract light emitted by active layers 430 from LED 400, the semiconductor material layers may be etched to expose semiconductor layer 420 and to form a mesa structure that includes layers 420-460. The mesa structure may confine carriers within the injection area of the device. Etching the mesa structure may lead to the formation of mesa sidewalls that may be orthogonal to the growth planes. A passivation layer 470 may be formed on the sidewalls of the mesa structure. Passivation layer 470 may include an oxide layer, such as a SiO$_2$ layer, and may act as a reflector to reflect emitted light out of LED 400. A contact layer 480, which may include a metal layer, such as Al, Au, Ni, Ti, or any combination thereof, may be formed on semiconductor layer 420 and may act as an electrode of LED 400. In addition, another contact layer 490, such as an Al/Ni/Au metal layer, may be formed on conductive layer 460 to act as another electrode of LED 400.

When a voltage signal is applied to contact layers 480 and 490, electrons and holes may recombine in active layers 430, where the recombination of electrons and holes may cause photon emission. The wavelength and energy of the emitted photons may depend on the energy bandgap between the valence band and the conduction band in active layers 430. For example, InGaN active layers may emit green or blue light, while AlInGaP active layers may emit red, orange, yellow, or green light. The emitted photons may be reflected by passivation layer 470 and may exit LED 400 from the top (e.g., the transparent ITO layer and thin contact layer) or bottom (e.g., substrate 410).

In some embodiments, LED 400 may include one or more other components, such as a lens, on the light emission surface, such as substrate 410, to focus or collimate the emitted light or couple the emitted light into a waveguide. In some embodiments, an LED may include a mesa of another shape, such as a planar, vertical, conical, semi-parabolic, or parabolic shape, where a base area of the mesa may be circular, rectangular, hexagonal, or triangular. For example, the LED may include a mesa of a curved shape (e.g., paraboloid shape) and non-curved shape (e.g., conic shape). The mesa may be truncated or non-truncated.

Figure 4B:
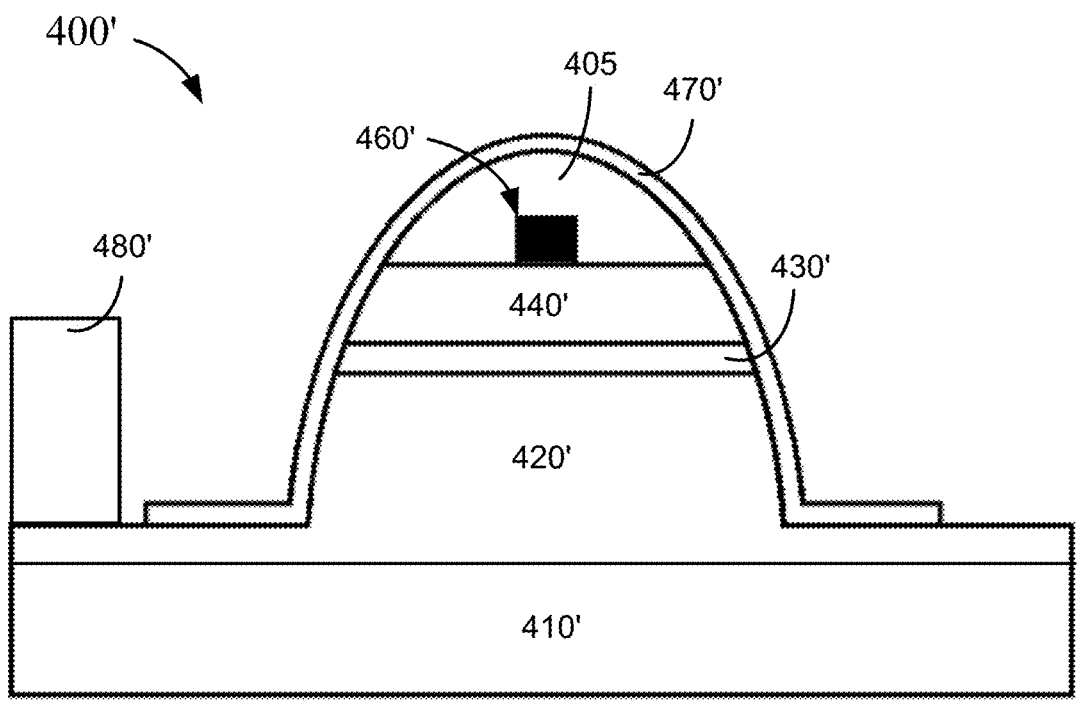
FIG. 4B is a cross-sectional view of an example of a light emitting diode including a parabolic mesa structure according to certain embodiments.

FIG. 4B is a cross-sectional view of an example of a light emitting diode 400' including a parabolic mesa structure. As LED 400, LED 400' may include multiple layers of semiconductor materials, such as multiple layers of III-V semiconductor materials. The semiconductor material layers may be epitaxially grown on a substrate 410', such as a GaN substrate or a sapphire substrate. For example, a semiconductor layer 420' may be grown on substrate 410'. Semiconductor layer 420' may include a III-V material, such as GaN, and may be p-doped (e.g., with Mg, Ca, Zn, or Be) or n-doped (e.g., with Si or Ge). One or more active layers 430' may be grown on semiconductor layer 420'. Active layers 430' may include one or more InGaN layers, one or more AlInGaP layers, or one or more GaN layers, which may form one or more heterostructures, such as one or more quantum wells. A semiconductor layer 440' may be grown on active layers 430'. Semiconductor layer 440' may include a III-V material, such as GaN, and may be p-doped (e.g., with Mg, Ca, Zn, or Be) or n-doped (e.g., with Si or Ge). One of semiconductor layer 420' and semiconductor layer 440' may be a p-type layer and the other one may be an n-type layer.

As shown on FIG. 4B, LED 400' may include a mesa that includes a dome top composed of a substantially transparent material 405, such as an oxide or a silicon compound (e.g., silicon oxide (SiOx) or silicon nitride (SiNx)). In some embodiments, transparent material 405 may include a material having a refractive index similar to that of semiconductor layer 440'. A reflector 470' may be formed on top of transparent material 405. In some embodiments, reflector 470' may include multiple layers of dielectric materials. In some embodiments, reflector 470' may include a metal layer, such as a layer of aluminum (Al) or silver (Ag). Reflector 470' may reflect light emitted in active layers 430' toward substrate 410'. In some embodiments, reflector 470' may be parabolic-shaped to act as a parabolic reflector.

Electrical contact 460' and electrical contact 480' may be formed on semiconductor layer 440' and semiconductor layer 420', respectively. Electrical contact 460' and electrical contact 480' may each include a conductive material, such as Al, Au, Ni, Ti, or any combination thereof, and may act as the electrodes of LED 400'. When a voltage signal is applied across electrical contacts 460' and 480', electrons and holes in active layers 430' may recombine, where the recombination of electrons and holes may be accompanied by photon emission. The emitted photons may propagate in many different directions, and may be reflected by reflector 470' towards substrate 410' and exit LED 400'. One or more other optical components, such as a lens, may be formed on the light emission surface, such as substrate 410', to focus or collimate the emitted light or couple the emitted light into a waveguide.

III. Improving Performance of Micro-LEDs

As described above, in semiconductor LEDs, light is usually generated at an internal quantum efficiency (IQE) through the recombination of electrons and holes within an active region (e.g., one or more active layers), where the internal quantum efficiency is the proportion of the radiative electron-hole recombination in the active region that emits photons. The generated light is then extracted from the LEDs in a particular direction or solid angle. The ratio between the number of emitted photons extracted from an LED and the number of electrons passing through the LED is referred to as the external quantum efficiency (EQE), which describes how efficiently the LED coverts injected electrons to photons that are extracted from the device. The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device.

For micro-LEDs with small die size, as the size of the LEDs decreases, the peak efficiency of the LEDs may generally decrease and/or the peak efficiency operating current density may increase. Various approaches may be used to improve the overall efficiency of an LED, such as optimizing the doping level or using the mesa structure to confine the carriers in the active region to increase the injection efficiency, and using reflective layer (e.g., passivation layer 470 or reflector 470') on the sidewalls or the dome of the mesa structure to direct the light out of the LED to increase the extraction efficiency.

The internal quantum efficiency (IQE) of LEDs, such as III-nitride (e.g., GaN) LEDs, depends on the relative rates of competitive radiative (light producing) recombination and non-radiative (lossy) recombination that occur in the active region of the device. Although LEDs may achieve a high peak IQE under a lower injection current, their efficiencies may start to drop with increasing current injection, which may be referred to as efficiency droop. Non-radiative recombination processes in the active region include Shockley-Read-Hall (SRH) recombination at defect sites and eeh or ehh Auger recombination, which may be a major cause of efficiency droop. The internal quantum efficiency of an LED may be determined by:

$$IQE = \frac{BN^2}{AN + BN^2 + CN^3}, \qquad (1)$$

where A, B and C are the rates of SRH recombination, bimolecular (radiative) recombination, and Auger recombination, respectively, and N is the charge-carrier density (i.e., charge-carrier concentration) in the active region.

Figure 5:
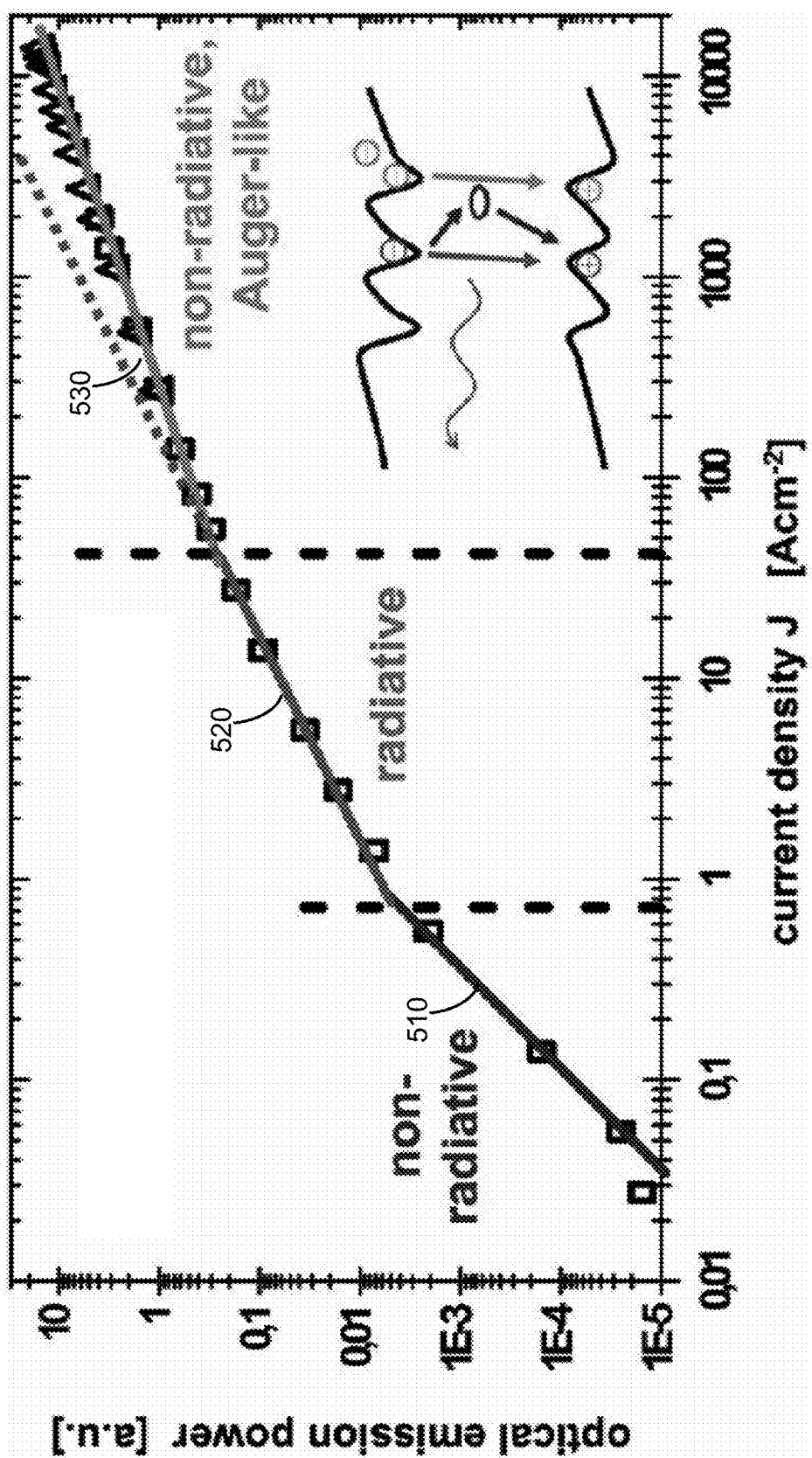
FIG. 5 illustrates the relationship between the optical emission power and the current density of a light emitting diode.

FIG. 5 illustrates the relationship between the optical emission power and the current density of a light emitting diode. As illustrated by a curve 510 in FIG. 5, the optical emission power of a micro-LED device may be low when the current density (and thus the charge carrier density N) is low, where the low external quantum efficiency may be caused by the relatively high non-radiative SRH recombination when the charge carrier density N is low according to equation (1). As the current density (and thus the charge carrier density N) increases, the optical emission power may increase as shown by a curve 520 in FIG. 5, because the radiative recombination may increase at a higher rate ($\propto N^2$) than the non-radiative SRH recombination ($\propto N$) when the charge carrier density N is high according to equation (1). As the current density increases further, the optical emission power may increase at a slower rate as shown by a curve 530 in FIG. 5 and thus the external quantum efficiency may drop because, for example, the non-radiative Auger recombination may increase at a higher rate ($\propto N^3$) than the radiative recombination ($\propto N^2$) when the charge carrier density N is sufficiently high according to equation Auger recombination is a non-radiative process involving three carriers. Auger recombination may be a major cause of efficiency droop and may be direct or indirect. For example, direct Auger recombination occurs when an electron and a hole recombine, but instead of producing light, either an electron is raised higher into the conduction band or a hole is pushed deeper into the valence band. Auger recombination may be reduced to mitigate the efficiency droop by lowering the charge-carrier density N in the active region for a given injection current density J, which may be written as:

$$J = gd_{eff}(AN + BN^2 + CN^3), \qquad (2)$$

where $d_{eff}$ is the effective thickness of the active region. Thus, according to equation (1), the effect of the Auger recombination may be reduced and thus the IQE of the LED may be improved by reducing the charge-carrier density N for a given injection current density, which may be achieved by increasing the effective thickness of the active region $d_{eff}$. The effective thickness of the active region may be increased by, for example, growing multiple quantum wells (MQWs). Alternatively, an active region including a single thick double heterostructure (DH) may be used to increase the effective thickness of the active region.

One factor affecting the effective thickness of the active region is the presence of internal fields $E_{qw}$ (e.g., strain-induced internal field) in the quantum wells. Internal fields $E_{qw}$ may localize charge carriers and reduces the overlap integral between carrier wave functions, which may reduce the radiative efficiency of LEDs. Some LEDs including heterostructures (e.g., quantum wells) formed using III-nitride materials may have a strong internal strain-induced piezoelectric field in the carrier transport direction. The strain-induced internal field may cause the electron and hole energy levels to shift (thus changing the bandgap) and cause the electrons and holes to shift to opposite sides of a quantum well, thus decreasing the spatial electron-hole overlap and reducing the radiative recombination efficiency and thus the internal quantum efficiency of the LED.

Figure 6B:
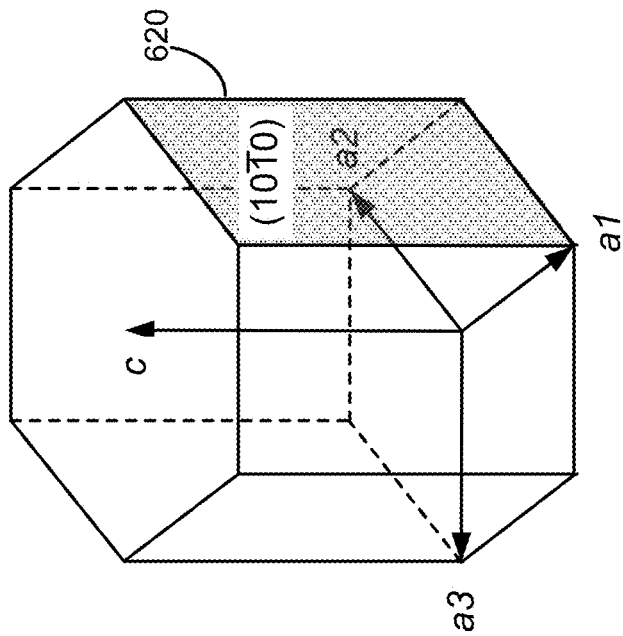
FIGS. 6A and 6B illustrate the hexagonal crystal lattice structure of an example of a III-nitride semiconductor material.
Figure 6A:
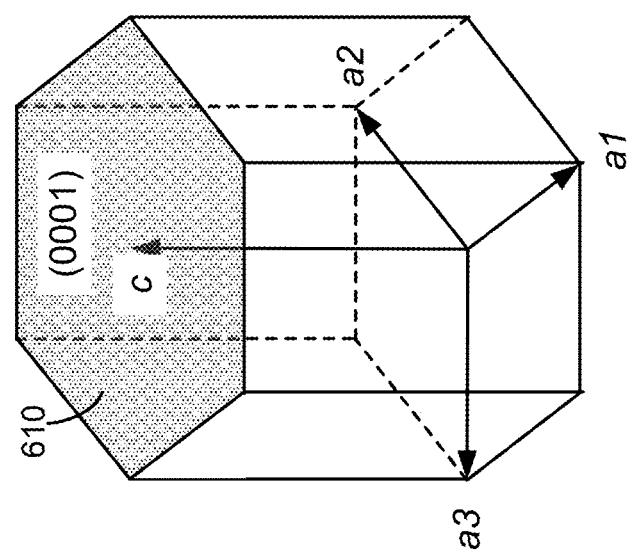

FIGS. 6A and 6B illustrate the hexagonal crystal lattice structure of an example of a III-nitride semiconductor material 600. Semiconductor material 600 may include, for example, a sapphire substrate or a GaN substrate that has a Wurtzite hexagonal lattice including a 6-fold rotation and 2 mirror planes as shown in the figures. The planes of a hexagonal lattice can be represented by four Miller-Bravais indices a1, a2, a3, and c as (a1, a2, a3, c), where a1+a2+a3=0. For example, a1+a2+a3=0 and c≠0 defines a sets of parallel planes (e.g., c-planes 610) that has different index c along the c-axis, which are polar planes that have the maximum spontaneous polarization in the direction perpendicular to the planes as a result of unequal numbers of nitride atoms and gallium atoms in the double monolayer. An example of a c-plane 610 is shown in FIG. 6A. When index c of a plane is nonzero, and any of the a1 and a2 indices of the plane is nonzero, the plane is a semi-polar plane. If index c of a plane is 0, the plane is featured by a zero polarization field in the direction perpendicular to the plane and is thus referred to as a "nonpolar" plane. An example of a nonpolar m-plane 620 is shown in FIG. 6B.

In polar crystals, such as GaN, the spontaneous polarization in the growth direction is at the maximum for crystals grown on the c-plane (i.e., polar plane). The polarization may change directions for crystals grown on planes of other orientations. Thus, the polarization in the growth direction may decrease for crystals grown on planes that make angles 0°<θ<90° with the c-plane (i.e., the semi-polar planes), and may become zero (nonpolar) for crystals grown on planes perpendicular to the polar plane (i.e., the nonpolar planes). Piezoelectric polarization in InGaN/GaN structures may behave in a similar manner, and thus the piezoelectric polarization may also differ for planes with different orientations. Thus, heterostructures (e.g., quantum wells) based on these polar crystals may have a strong internal electric field induced by the piezo- and spontaneous polarization along the most natural crystal growth direction [0001] (i.e., the c-axis). As such, carriers in heterostructures grown on the c-plane may experience a strong polarization-induced internal field in their transport direction (e.g., the heterostructure growth direction). The polarization-induced internal fields in the carrier transport direction may cause a shift of the exciton emission energy inside these heterostructures, where electrons and holes may also be shifted to opposite sides of the well and confined by the well.

Figures 7A, 7B:
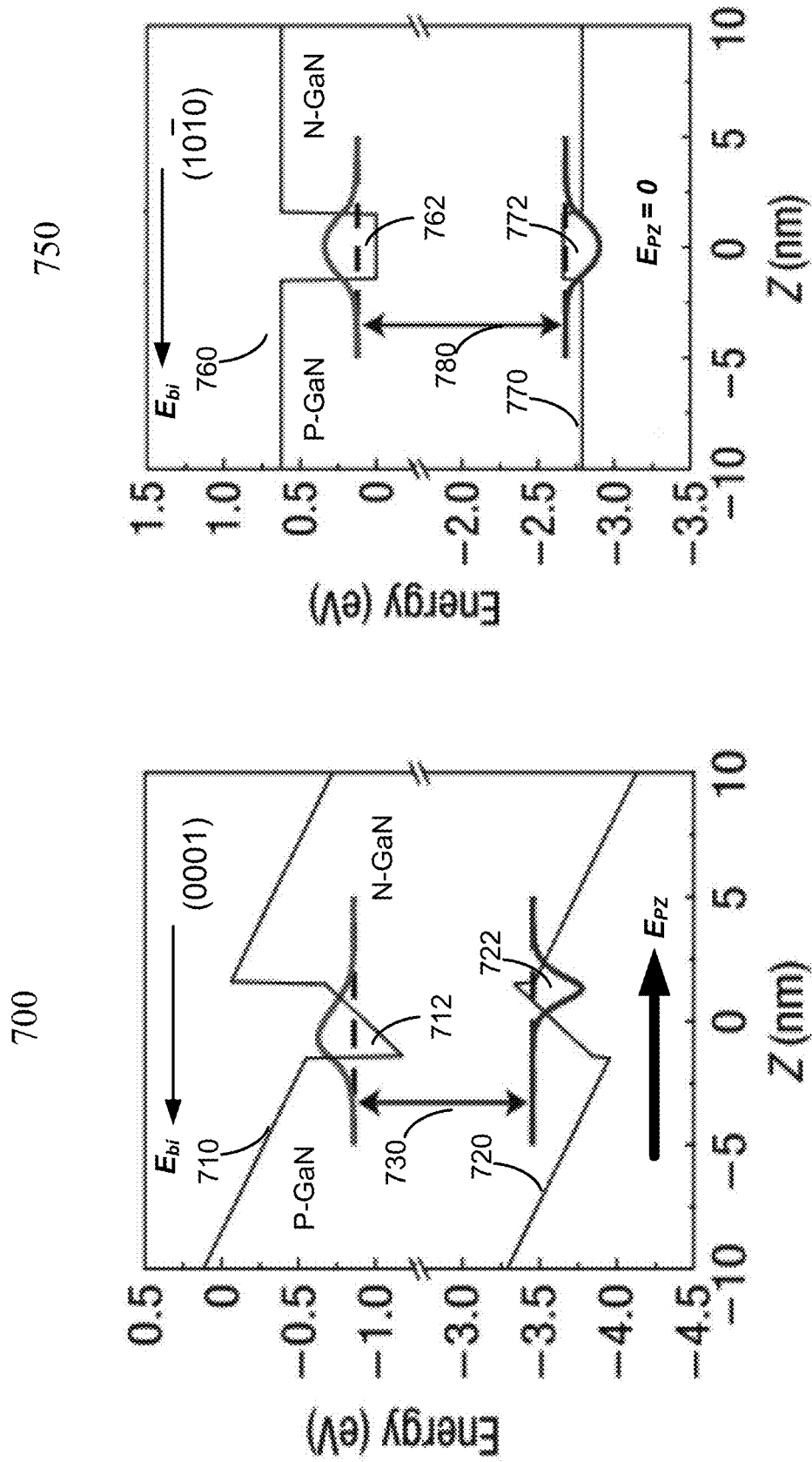
FIG. 7A illustrates energy bands of an example of a semiconductor quantum well device grown on a polar plane of a substrate.
FIG. 7B illustrates energy bands of an example of a semiconductor quantum well device grown on a nonpolar plane of a substrate.

FIG. 7A illustrates energy bands of an example of a semiconductor quantum well device 700 grown on a polar plane of a semiconductor substrate. In the absence of an electric field, electrons and holes in a quantum well may only occupy states within a discrete set of energy sub-bands. Thus, only a discrete set of frequencies of light may be absorbed or emitted by the quantum well. When an electric field is applied to the quantum well, the carrier states may shift. In a semiconductor quantum well device grown on the polar c-plane of a semiconductor substrate, the piezoelectric field $E_{PZ}$ in the growth direction (i.e., the carrier transport direction in the quantum well) may be the strongest and may be much higher than the built-in electric field $E_{bi}$ of a p-n junction. Thus, as shown in FIG. 7A, the electron energy level 712 in conduction band 710 may shift to lower energy levels, while the hole energy level 722 in valence band 720 may shift to higher energy levels. Thus, a bandgap 730 between the conduction band and valence band may reduce, which in turn reduces the frequency of the absorbed or emitted light.

Additionally, the electric field may shift electrons and holes to opposite sides of the quantum well. For example, as shown in FIG. 7A, the electron energy level 712 in conduction band 710 and the hole energy level 722 in valence band 720 are tilted in the quantum well due to the electric field. Thus, more electrons may be close to the p-GaN side, and more holes may be close to the N-GaN side. This spatial separation between the electrons and holes is limited by the presence of the potential barriers around the quantum well, and may cause a drastic decrease of the spatial electron-hole overlap (and hence the overlap integral of the holes and the electrons or the effective thickness $d_{eff}$ of the active region) in the direction of the c-axis, which may in turn reduce the radiative recombination rate and thus the internal quantum efficiency of the system.

FIG. 7B illustrates energy bands of an example of a semiconductor quantum well device 750 grown on a non-polar plane (e.g., m-plane) of a substrate. In a semiconductor quantum well device grown on the nonpolar m-plane of the substrate, the piezoelectric field $E_{PZ}$ in the growth direction may be zero, and the built-in electric field $E_{bi}$ of a p-n junction may be relatively low. Thus, as shown in FIG. 7B, the electron energy level 762 in conduction band 760 may be flat or may have a minimum shift, and the hole energy level 772 in valence band 770 may be flat or have a minimum shift. Thus, in contrast to bandgap 730 shown in FIG. 7A, bandgap 780 between the conduction band and valence band in semiconductor quantum well device 750 may not be reduced, and thus the frequency of the absorbed or emitted light may not be reduced. In addition, because electron energy level 762 in conduction band 760 and hole energy level 772 in valence band 770 in the quantum well may be flat, the distribution of electrons and holes in the quantum well may be uniform and may overlap in the entire quantum well region. As such, the overlap integral of the holes and the electrons and thus the radiative recombination rate and the internal quantum efficiency of semiconductor quantum well device 750 may be high.

While the Auger recombination due to high current density (and high charge carrier density) may be an intrinsic process depending on material properties, non-radiative SRH recombination depends on the quality of material, such as the defect density in the active region. As described above with respect to FIGS. 4A and 4B, LEDs may be fabricated by etching a mesa structure into the active emitting layers to confine carriers within the injection area of the device and to expose the n-type material beneath the active emitting layers for electrical contact. Etching the mesa structures may lead to the formation of mesa sidewalls that are orthogonal to the growth plane. Active region in proximity to the exposed sidewalls may have a higher rates of SRH recombination than the bulk region that is far from the surface, due to a higher density of defects formed during the etch. Charge carriers injected into active regions that are within a minority carrier diffusion length from the surface may be subject to the higher SRH recombination rate, where the minority carrier diffusion length is the average distance a minority carrier moves before recombining.

For traditional, broad area LEDs used in lighting and backlighting applications (e.g., with about 0.1 mm² to about 1 mm² lateral device area), the sidewall surfaces are at the far extents of the devices and the devices can be designed such that little or no current is injected into regions within a minority carrier diffusion length of the mesa sidewalls, and thus the overall rate of SRH recombination may be low. However, in micro-LEDs, such as III-nitride micro-LEDs fabricated on (0001) oriented (i.e., c-plane) substrate (e.g., sapphire or GaN), as the size of the LED is reduced to a value comparable to or having a same order of magnitude as the minority carrier diffusion length (which may depend on the doping density and may be between, for example, about 0.1 µm to about 1 µm), a greater proportion of the total active region falls within the minority carrier diffusion length from the LED sidewall surface and thus more injected carriers are subjected to the higher SRH recombination rate. This can cause the leakage current of the LED to increase and the efficiency of the LED to decrease as the size of the LED decreases, and/or cause the peak efficiency operating current to increase as the size of the LED decreases.

Non-radiative surface recombination may be governed, in part, by the surface recombination velocity (SRV) of the material, which describes the rate at which charge carriers are captured by a surface defect. Surface recombination velocity of a material may be reduced by passivating the surface with a suitable dielectric material, such as $SiO_2$, $SiN_x$, or $Al_2O_3$. The SRV may also be reduced by etching away highly defective surface material using a chemical treatment. Despite these efforts to reduce surface recombination, when the micro-LED mesa size reduces, the efficiency of the micro-LED generally still decreases and the peak efficiency operating current density generally still increases. These effects can lower the overall electrical-to-optical power conversion efficiency (referred to as the wall-plug efficiency) of the device.

Figure 8:
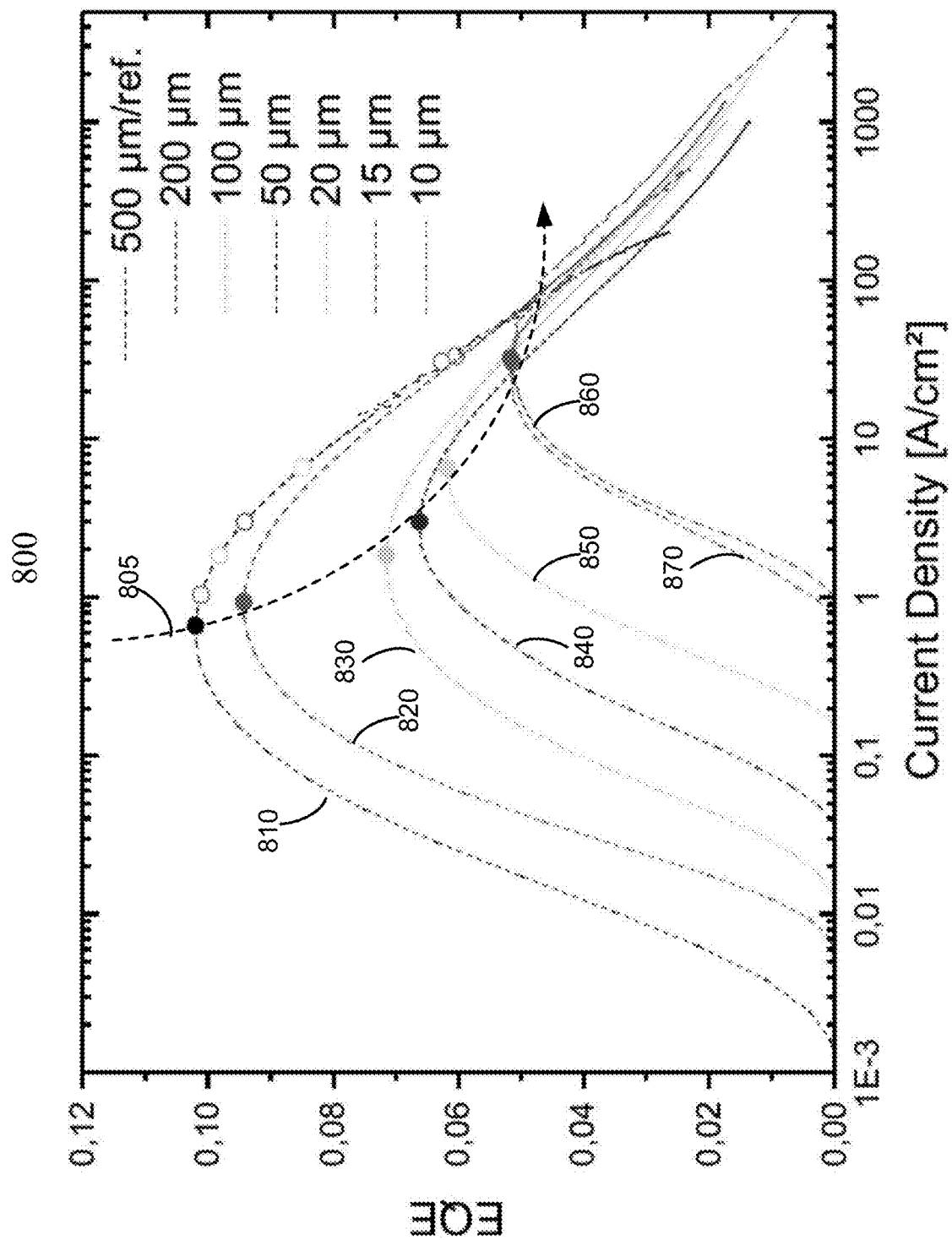
FIG. 8 illustrates the relationship between the external quantum efficiency and the current density for examples of polar micro-LED devices of different sizes.

FIG. 8 is a chart 800 illustrating the relationship between the external quantum efficiency and the current density for examples of polar micro-LED devices of different sizes. The x-axis in chart 800 represents the current density (in $A/cm^2$) of an LED device in logarithmic scale, and the y-axis represents the external quantum efficiency of the LED device at the corresponding current density. In the examples illustrated in FIG. 8, the micro-LED devices are fabricated on III-nitride materials grown on the c-plane of a substrate. Curve 810 shows the external quantum efficiency as a function of the current density for a micro-LED device having a linear dimension of about 500 µm. Curves 820, 830, 840, 850 show the external quantum efficiency as a function of the current density for micro-LED devices having a linear dimension of about 200 µm, about 100 µm, about 50 µm, and about 20 µm, respectively. Curves 860 and 870 show the external quantum efficiency as a function of the current density for micro-LED devices having a linear dimension of about 15 µm and about 10 µm, respectively, which may be close to the order of magnitude of the minority carrier diffusion length.

As shown by curves 810-870, the external quantum efficiency of a micro-LED device may be low when the current density (and thus the charge carrier density N) is low, where the low external quantum efficiency may be caused by the relatively high non-radiative SRH recombination or leakage when the charge carrier density N is low according to equation (1). As the current density (and thus the charge carrier density N) increases, the external quantum efficiency may increase because the radiative recombination may increase at a higher rate than the non-radiative SRH recombination. The external quantum efficiency may reach a peak value at a certain current density value, after which the external quantum efficiency may drop due to, for example, the relatively high non-radiative Auger recombination as described above.

As shown by a trend curve 805 in FIG. 8, in general, the larger the micro-LED, the higher the peak efficiency. For example, the peak efficiency of the micro-LED having a linear dimension of about 10 µm (shown by curve 870) may be much lower than the peak efficiency of the micro-LED having a linear dimension of about 500 µm (shown by curve 810). In addition, in general, the larger the micro-LED, the lower the current density needed to achieve the peak efficiency. For example, the peak efficiency current density of the micro-LED having a linear dimension of about 10 µm (shown by curve 870) may be much higher (e.g., >10 times) than the peak efficiency current density of the micro-LED having a linear dimension of about 500 µm (shown by curve 810). Furthermore, FIG. 8 shows that the onset of EQE appears at higher current densities for smaller LEDs due to, for example, leakage current and/or an increased proportion of non-radiative SRH recombination at sidewall defects. As shown in FIG. 8, the smaller micro-LED devices (e.g., having a linear dimension of about 15 µm or about 10 µm) may have significant low-voltage leakage or SRH recombination, where the EQE at a current density below about 1 $A/cm^2$ is very small.

As described above, conventional III-nitride LEDs grown on the (0001) plane (i.e., c-plane) oriented GaN may have a higher low-voltage leakage, a lower efficiency at a same current density, a lower peak efficiency, and a higher operating current density to achieve the peak efficiency, when the device shrinks. III-nitride LEDs can be grown on other crystal planes, such as semi-polar growth planes between the polar c-plane and non-polar a- and m-planes.

Figure 9B:
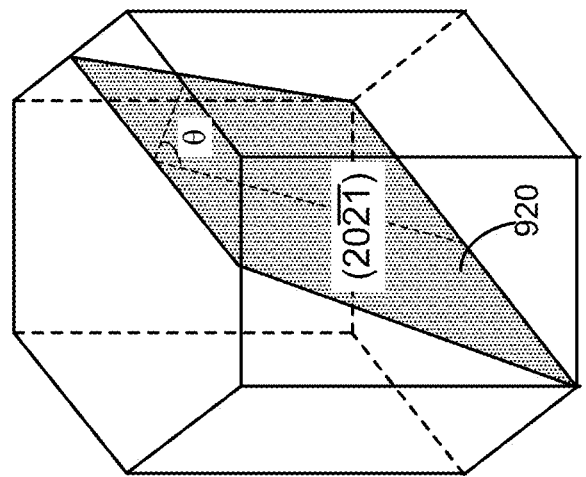
FIG. 9B illustrates another example of a semi-polar plane in a crystal material having a hexagonal crystal lattice structure according to certain embodiments.
Figure 9A:
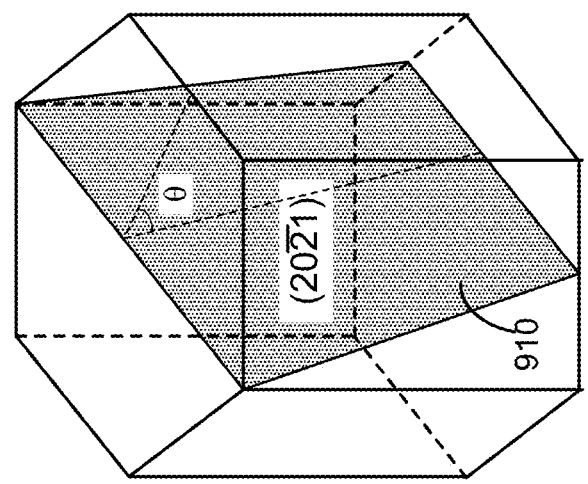
FIG. 9A illustrates an example of a semi-polar plane in a crystal material having a hexagonal crystal lattice structure according to certain embodiments.

FIG. 9A illustrates an example of a semi-polar plane 910 in a crystal material 900 having a hexagonal crystal lattice structure according to certain embodiments. FIG. 9B illustrates another example of a semi-polar plane 920 in crystal material 900 having a hexagonal crystal lattice structure according to certain embodiments. Crystal material 900 may include, for example, a III-V semiconductor material, such as GaN, or sapphire. Semi-polar plane 910 shown in FIG. 9A is the (20$\bar{2}$1) plane, which forms an angle θ about 75° with respect to the c-plane. The (20$\bar{2}$1) plane may be a majority-N plane, where a majority of elements on the plane are N. Semi-polar plane 920 shown in FIG. 9B is the (20$\bar{2}$$\bar{1}$) plane, which forms an angle θ about 105° with respect to the c-plane. The (20$\bar{2}$$\bar{1}$) plane may be a majority-Ga plane, where a majority of elements on the plane are Ga. Crystal material 900 may be cut along a semi-polar plane, such as the (20$\bar{2}$1) plane or the (20$\bar{2}$$\bar{1}$) plane, and the facet of crystal material 900 cut along the semi-polar plane may be used as the growth surface on which epitaxial layers can be grown for fabricating micro-LEDs. GaN layers grown on the (20$\bar{2}$1) plane and GaN layers grown on the (20$\bar{2}$$\bar{1}$) plane may have identical stress states but opposite polarization states. For example, an active layer grown on the (20$\bar{2}$$\bar{1}$) plane may have a polarization discontinuity at the active region interface with the same sense (i.e. similar direction, different magnitude) as conventional c-plane GaN, whereas an active layer grown on the (20$\bar{2}$1) plane may have a polarization discontinuity of the opposite sense to that of (20$\bar{2}$$\bar{1}$) plane or c-plane GaN layer.

According to certain embodiments, micro-LEDs are fabricated on III-nitride material (e.g., GaN) layers having certain semi-polar crystal orientations. The III-nitride material layers may be grown on a substrate (e.g., GaN or sapphire) that is cut along a semi-polar plane and thus may have a surface in the semi-polar plane. The fabricated micro-LED can achieve a better efficiency performance than micro-LED devices fabricated on III-nitride materials with conventional (e.g., c-plane) orientations. More specifically, for micro-LEDs fabricated on III-nitride materials with certain semi-polar orientations between the polar c-plane and non-polar a- or m-plane, the quantum efficiency of the micro-LEDs does not drop with decreasing micro-LED size, and the operating current at the peak quantum efficiency does not increase with decreasing micro-LED size. Thus, GaN materials with certain orientations can produce better performing micro-LED devices than GaN materials with conventional c-plane orientations.

Micro-LEDs with different semi-polar orientations are manufactured and tested. The experimental results show that using GaN materials with certain semi-polar orientations, such as the (20$\bar{2}$1) plane GaN material, can result in a sustained peak quantum efficiency and a sustained low (~1 A/cm') peak efficiency drive current density as the micro-LED size decreases. On some other crystallographic orientations, such as the (20$\bar{2}\bar{1}$) plane, typical efficiency characteristics with decreasing mesa size as shown in FIG. 8 are observed.

Thus, the orientation of the growth plane may significantly affect the device performance. For example, the device may perform better when the device is grown on a semi-polar plane that has an angle between 0° and 90° (such as between about 45° and about 90° or between about 60° and about 90°) with respect to the c-plane. This higher performance of semi-polar GaN micro-LEDs may be due to, for example, the unique crystallography of the semi-polar mesas grown on certain semi-polar planes, where the exposed sidewall facets of the semi-polar micro-LEDs are different from the exposed sidewall facets of conventional c-plane LEDs. For example, the exposed sidewall facets may be majority-N planes, where a majority of the elements in the planes are N, rather than Ga. The exposed sidewall facets may also be easier to passivate with a dielectric material or may be less susceptible to the formation of surface defects. Alternatively or additionally, the defects in semiconductor material layers grown on these semi-polar planes may have an inherently lower SRV, or the lateral diffusion length of the minority carriers may be smaller for semiconductor material layers with the semi-polar orientations. As such, the non-radiative SRH recombination may be reduced even for micro-LEDs with small lateral sizes, such as 5 μm or smaller.

Figure 10:
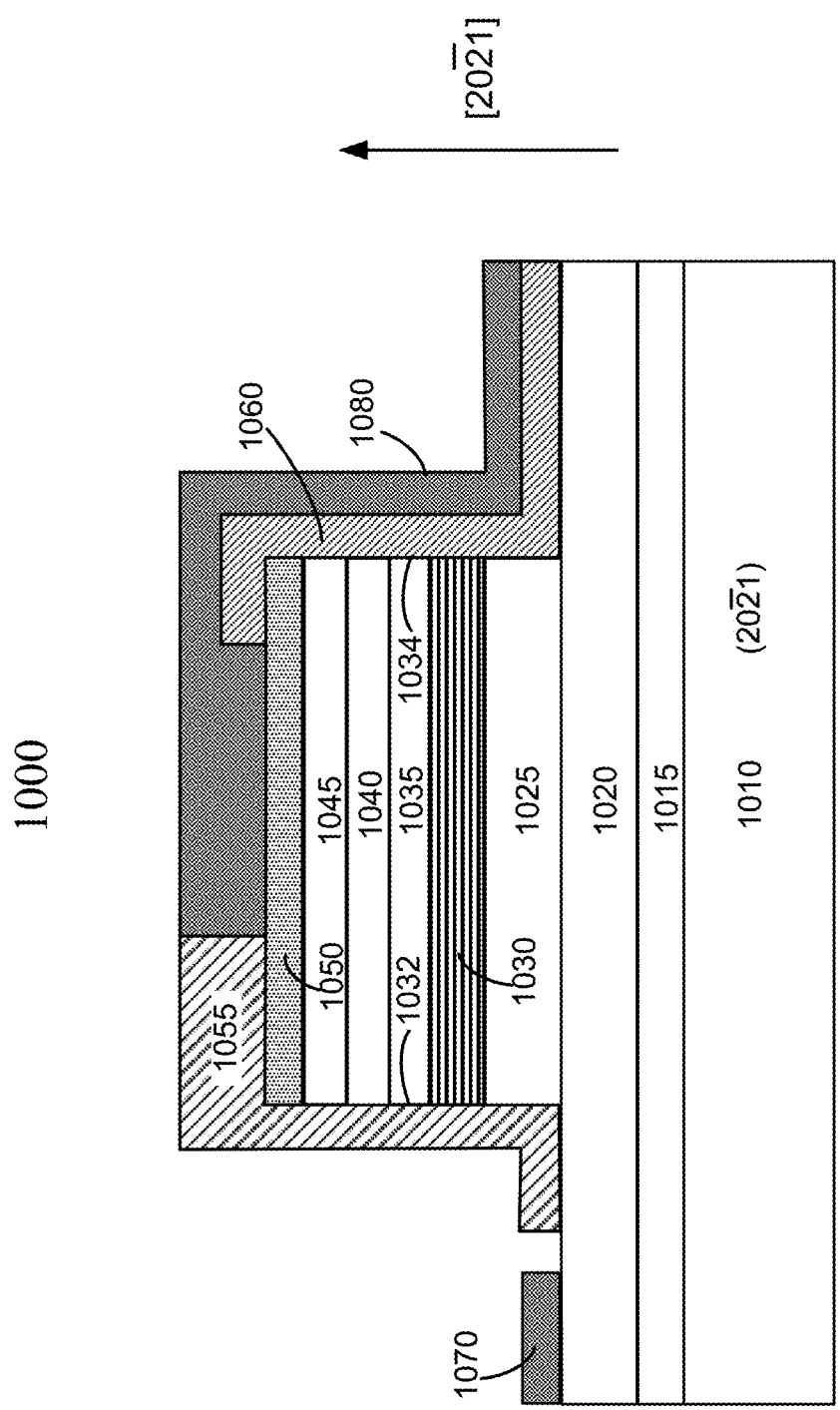
FIG. 10 illustrates an example of a micro-LED device including semiconductor materials having a semi-polar crystal lattice orientation according to certain embodiments.

FIG. 10 is a cross-sectional view of an example of a micro-LED device 1000 including semiconductor materials having a semi-polar crystal lattice orientation according to certain embodiments. Micro-LED device 1000 may include a substrate 1010, where a surface 1012 of substrate 1010 is a semi-polar (20$\bar{2}$1) plane. Substrate 1010 may include, for example, a sapphire substrate, a GaN substrate, or another III-V semiconductor substrate. A buffer layer 1015 may be grown on surface 1012 of substrate 1010. Buffer layer 1015 may be used to accommodate the differences in two crystallographic structures and to reduce misfit strain and misfit dislocations. One example of buffer layer 1015 may include an undoped or unintentionally doped (UID) GaN. An n-GaN layer 1020 may be formed on buffer layer 1015. N-GaN layer 1020 may be a GaN layer doped with, for example, silicon or germanium. A barrier layer 1025 may be formed on n-GaN layer 1020. Barrier layer 1025 may include, for example, InGaN/GaN superlattice. An active layer 1030 may be formed on barrier layer 1025. Active layer 1030 may include one or more quantum wells, such as a multiple-quantum-well (MQW) including multiple (e.g., 2-6) quantum wells. In one example, active layer 1030 may include an InGaN/GaN MQW that can generate green or blue light (e.g., at about 447 nm). An electron-blocking layer 1035 may be formed on active layer 1030 to reduce the electron leakage current and improve the efficiency of the LED. A p-GaN layer 1040 may be formed on electron-blocking layer 1035. p-GaN layer 1040 may be doped with, for example, Mg, Mg, Ca, Zn, or Be. A p$^+$-GaN layer 1045 (or p$^{++}$-GaN layer) may be formed on p-GaN layer 1040 to reduce the contact resistance. A conductor layer 1050, such as a transparent ITO layer, may be deposited on p$^+$-GaN layer 1045.

The layer stack that includes barrier layer 1025, active layer 1030, electron-blocking layer 1035, p-GaN layer 1040, p$^+$-GaN layer 1045, conductor layer 1050, and, in some embodiments, a portion of n-GaN layer 1020 may be etched to form a mesa structure. The mesa structure may include sidewalls 1032 and 1034, which may be passivated by a passivation layer that includes, for example, a $SiO_2$, $SiN_x$, or $Al_2O_3$ layer. In some embodiments, at least some portions of sidewall 1032 or 1034 may be coated with an omnidirectional reflector (ODR) that includes, for example, $Ta_2O_5$ and/or $SiO_2$. Electrode layers 1070 and 1080 may then be formed on n-GaN layer 1020 and conductor layer 1050, respectively. Electrode layers 1070 and 1080 may include, for example, Al, Ni, Au, or any combination thereof.

Figure 11:
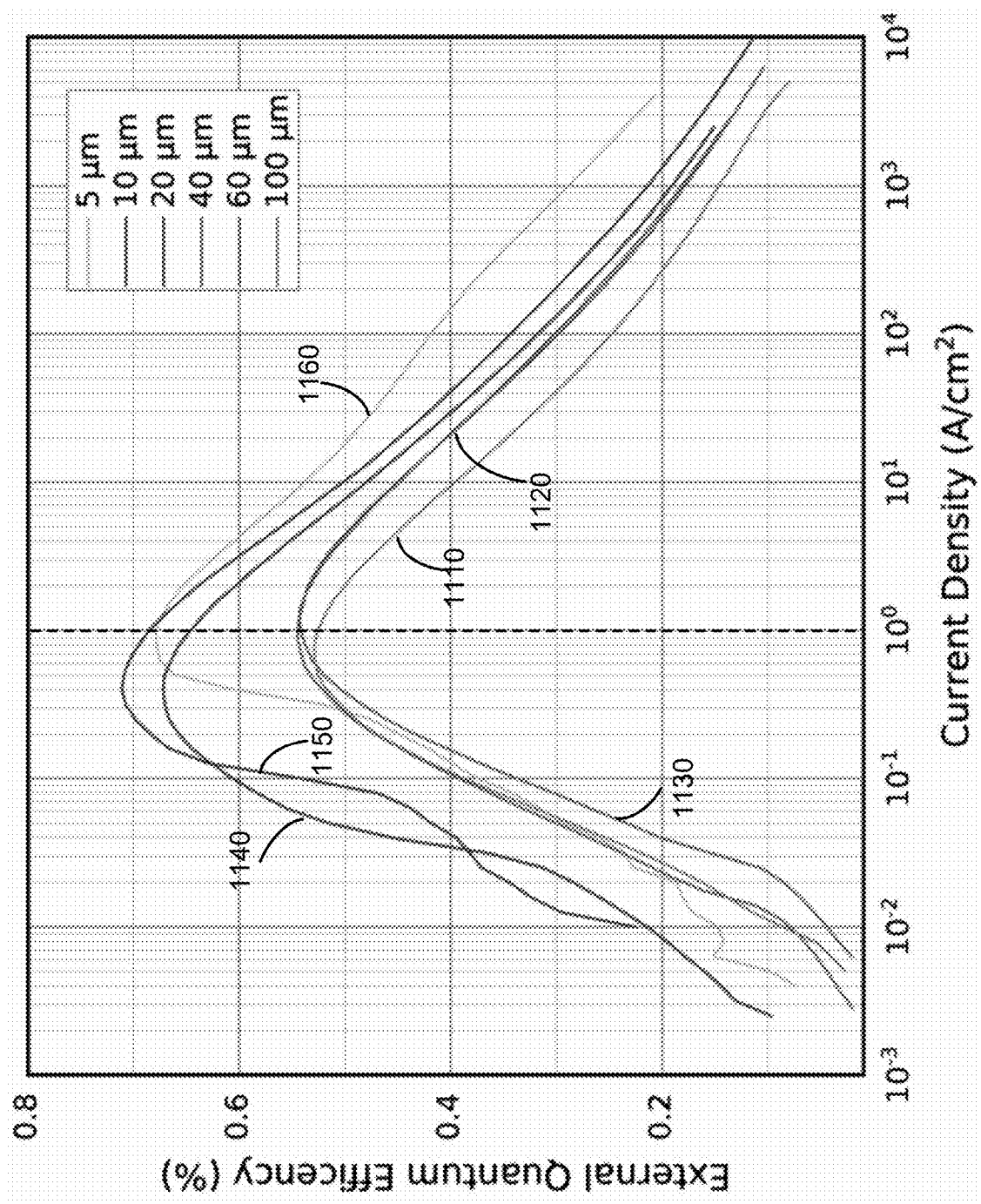
FIG. 11 illustrates the relationship between external quantum efficiency and current density for examples of semi-polar micro-LED devices having different sizes according to certain embodiments.

FIG. 11 illustrates the relationship between external quantum efficiency and current density for examples of semi-polar micro-LED devices having different sizes according to certain embodiments. The examples of micro-LED devices shown in FIG. 11 are grown on the semi-polar (20$\bar{2}$1) facet of GaN substrates. The examples of micro-LED devices shown in FIG. 11 may have a structure as shown in FIG. 10 and may emit green light. Curve 1110 illustrates the external quantum efficiency as a function of the current density for a micro-LED device having a linear dimension of about 100 μm. Curves 1120, 1130, 1140, 1150 show the external quantum efficiency as a function of the current density for micro-LED devices having a linear dimension of about 60 μm, about 40 μm, about 20 μm, and about 10 μm, respectively. Curve 1160 shows the external quantum efficiency as a function of the current density for a micro-LED device having a linear dimension of about 5 μm.

As shown by curves 1110-1160, the external quantum efficiency of a micro-LED device may be low when the current density (and thus the charge carrier density) is low, where the low external quantum efficiency may be caused by the relatively high non-radiative SRH recombination when the charge carrier density is low. As the current density increases, the external quantum efficiency may increase because the radiative recombination increases at a higher rate than the non-radiative SRH recombination when the charge carrier density is high. The external quantum efficiency may reach a peak value at a certain current density value, after which the external quantum efficiency may drop due to, for example, the higher non-radiative Auger recombination as described above.

As also shown by curves 1110-1160, for a same current density, the external quantum efficiency of a micro-LED device having a smaller die size (e.g., 5, 10, or 20 μm) may be similar to or higher than the external quantum efficiency of a micro-LED device having a larger die size (e.g., 40, 60, or 100 μm). The peak efficiency of micro-LED devices having a linear dimension of about 5 μm (shown by curve 1160), 10 μm (shown by curve 1150), and 20 μm (shown by curve 1140) may be about the same or even higher than the micro-LED devices having a linear dimension of about 100 μm (shown by curve 1110), a linear dimension of about 60 μm (shown by curve 1120), and a linear dimension of about 40 μm (shown by curve 1130). In addition, in general, the peak efficiency current density of the micro-LED having a linear dimension of about 5 μm (shown by curve 1160), 10 μm (shown by curve 1150), and 20 μm (shown by curve 1140) may be about the same (e.g., less than 1 A/cm$^2$) or even lower than the micro-LED devices having a linear dimension of about 100 μm (shown by curve 1110), a linear dimension of about 60 μm (shown by curve 1120), and a linear dimension of about 40 μm (shown by curve 1130). Furthermore, FIG. 11 shows that an EQE greater than a half of the peak EQE can be achieved for the micro-LED devices having a linear dimension of about 5 μm to about 100 μm at a current density of about 0.1 A/cm$^2$.

Thus, compared with the c-plane micro-LED devices (e.g., as shown in FIG. 8), the semi-polar micro-LEDs disclosed herein have a reduced low-voltage leakage for micro-LEDs having vertical mesas due to, for example, lower surface recombination losses as described above. Previously, a reduced low-voltage leakage is generally observed in micro-LEDs having parabolic-shaped mesas rather than vertical mesas. In addition, the semi-polar micro-LEDs disclosed herein can maintain their peak efficiency and have a low peak current density, for example, less than 1 A/cm$^2$, even when the linear dimension of the micro-LED decreases to about 5 μm.

Figure 12:
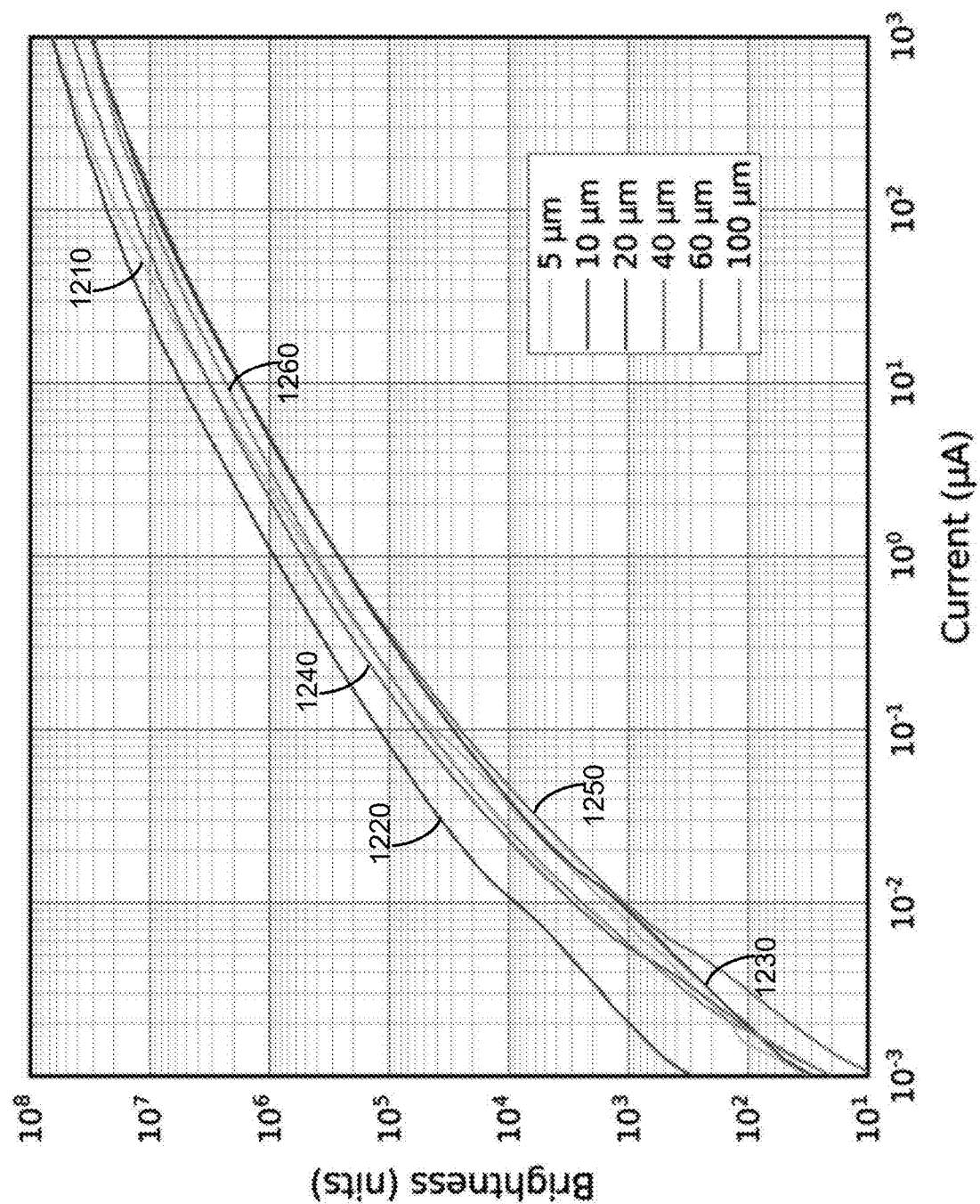
FIG. 12 illustrates the relationship between brightness and bias current for examples of semi-polar micro-LED devices having different sizes according to certain embodiments.

FIG. 12 illustrates the relationship between brightness within a given area and bias current for examples of semi-polar micro-LED devices having different sizes according to certain embodiments. The brightness measures how much light (the luminance) is sent by a light source within a given area, and can be described in nits (candelas per square meter (i.e., cd/m$^2$)). Curves 1210, 1220, 1230, 1240, 1250, and 1260 shown the brightness of micro-LEDs at different bias current (in μA) for micro-LEDs with a linear dimension of about 100 μm, 60 μm, 40 μm, 20 um, 10 μm, and 5 μm, respectively. As shown in FIG. 12, for a micro-LED having a 5×5 μm$^2$ vertical mesa and without light collimation, the brightness of the top-side Lambertian emission (through transparent p-contact, such as p$^+$-GaN layer 1045 and conductor layer 1050 shown in FIG. 10) is about 3 million nits within ±30° when the bias current is about 10 μA.

Figure 13:
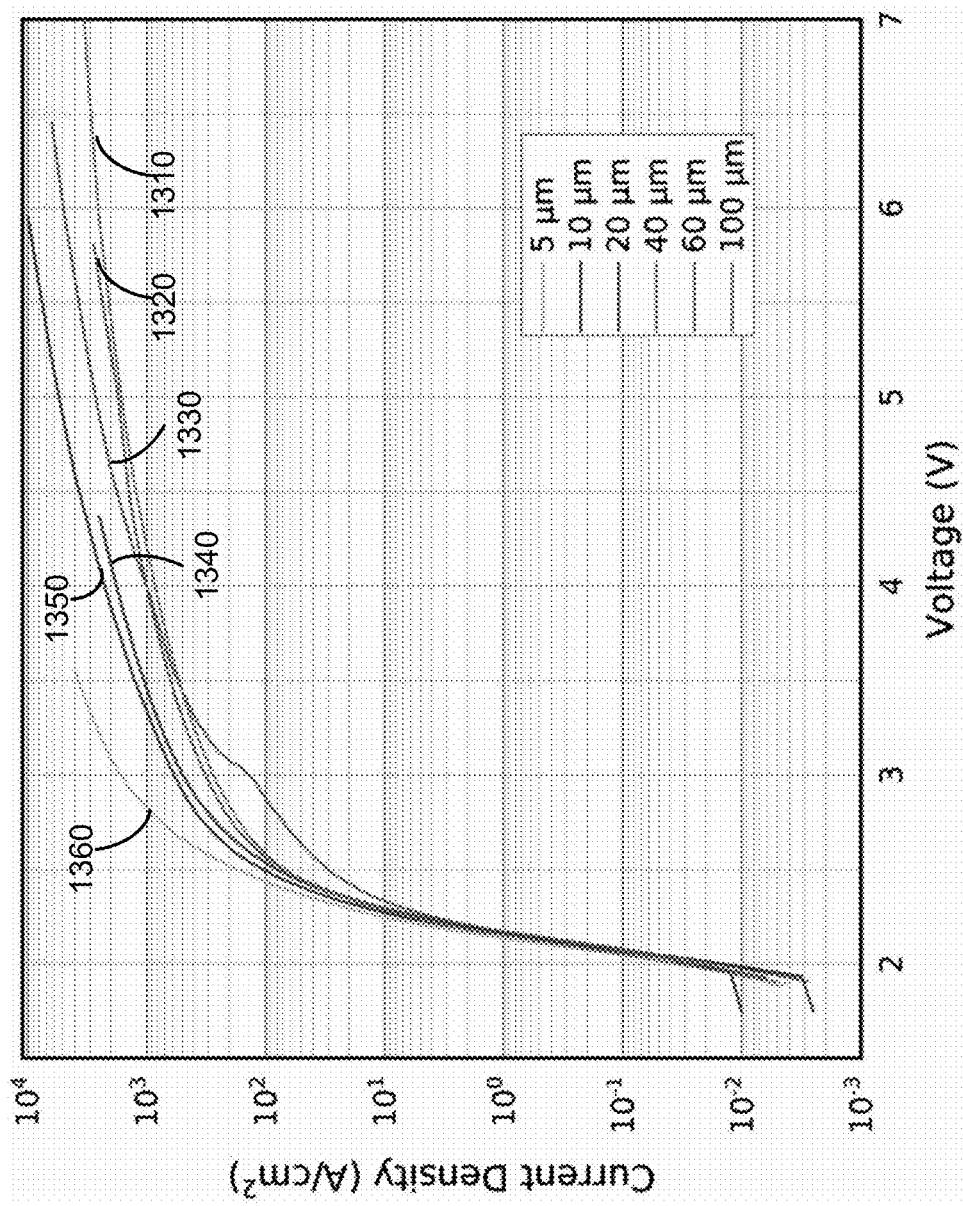
FIG. 13 illustrates the relationship between the current density in the active region and the applied voltage (e.g., I-V curves) for examples of semi-polar micro-LED devices having different sizes according to certain embodiments.

FIG. 13 illustrates the relationship between the current density in the active region and the applied voltage (e.g., I-V curves) for examples of semi-polar micro-LED devices having different sizes according to certain embodiments. Curves 1310, 1320, 1330, 1340, 1350, and 1360 show the I-V curves of semi-polar green micro-LEDs at different driving current (in μA) for micro-LEDs with a linear dimension of about 100 μm, 60 μm, 40 μm, 20 um, 10 μm, and 5 μm, respectively. FIG. 13 shows that the semi-polar green micro-LEDs disclosed herein exhibit good I-V characteristics, where the bias current increases exponentially with the increase of the bias voltage when the bias voltage is around 2 V. Such I-V characteristics may be due to the simplified active region structure and the optimized P$^+$-GaN or P$^{++}$-GaN contact layer as shown in FIG. 10.

As described above, the field in the heterostructure of an LED device may cause the electron and hole energy levels to shift (thus changing the bandgap), which may be referred to as the quantum-confined stark effect (QCSE). The QCSE arises when a quantum-confined system is subjected to an electric field along the axis of confinement. For semiconductor quantum wells, the field may skew the potential well, and cause the hole and electron energy levels to shift, thus decreasing the gap between these levels. These changes are accompanied by a change to the exciton binding energy due to a reduction of the Coulombic interaction as the electrons and holes become spatially separated. The quantum well barriers prevent field ionization that may occur in unconstrained systems under large fields. The QCSE usually manifests as a net decrease in energy of the exciton and thus a red-shift of its optical absorption resonance peak. Heterostructures grown on c-plane substrates may suffer from a strong internal electric field in the carrier transport direction induced by piezo- and spontaneous polarization parallel to the most natural crystal growth direction [0001] (i.e., the c-axis). The polarization-induced fields in the carrier transport direction cause a red-shift of the exciton emission energy inside these heterostructures. For example, as shown in FIG. 7A, due to the distortion of the energy bands caused by the polarization-induced internal field, the photoluminescence emission wavelength of a c-plane quantum well under zero bias may be red-shifted (i.e., having a longer wavelength and a lower energy) compared to a quantum well with no polarization effects. With increasing external bias voltage (and electrical field), the energy bands may flatten and the emission wavelength of the quantum well may blue-shift (i.e., having a shorter wavelength and a higher energy) as the internal electric fields are screened by the injection of free carriers.

As described above with respect to FIGS. 7A and 7B, polarization-induced internal fields in the growth direction are the highest for c-plane device and reach a minimum for m-plane device. For semi-polar planes having an angle θ with respect to the c-plane between 0° and 90° (such as between about 45° and about 90° or between about 60° and about 90°), the polarization field in the growth direction (and thus QCSE) lies somewhere between these extremes. For c-plane LEDs, the blue-shift between spontaneous emission and emission in the biased condition can be significant (e.g., >30 nm). For m-plane LEDs, high quality epitaxial growth of the light emitting material layers may be difficult. Unlike nonpolar GaN, semi-polar GaN may be capable of handling sufficient strain before catastrophic morphological breakdown occurs. As a result, semi-polar GaN may be capable of producing highly efficient LEDs with reduced QCSE and blue-shift.

Figure 14:
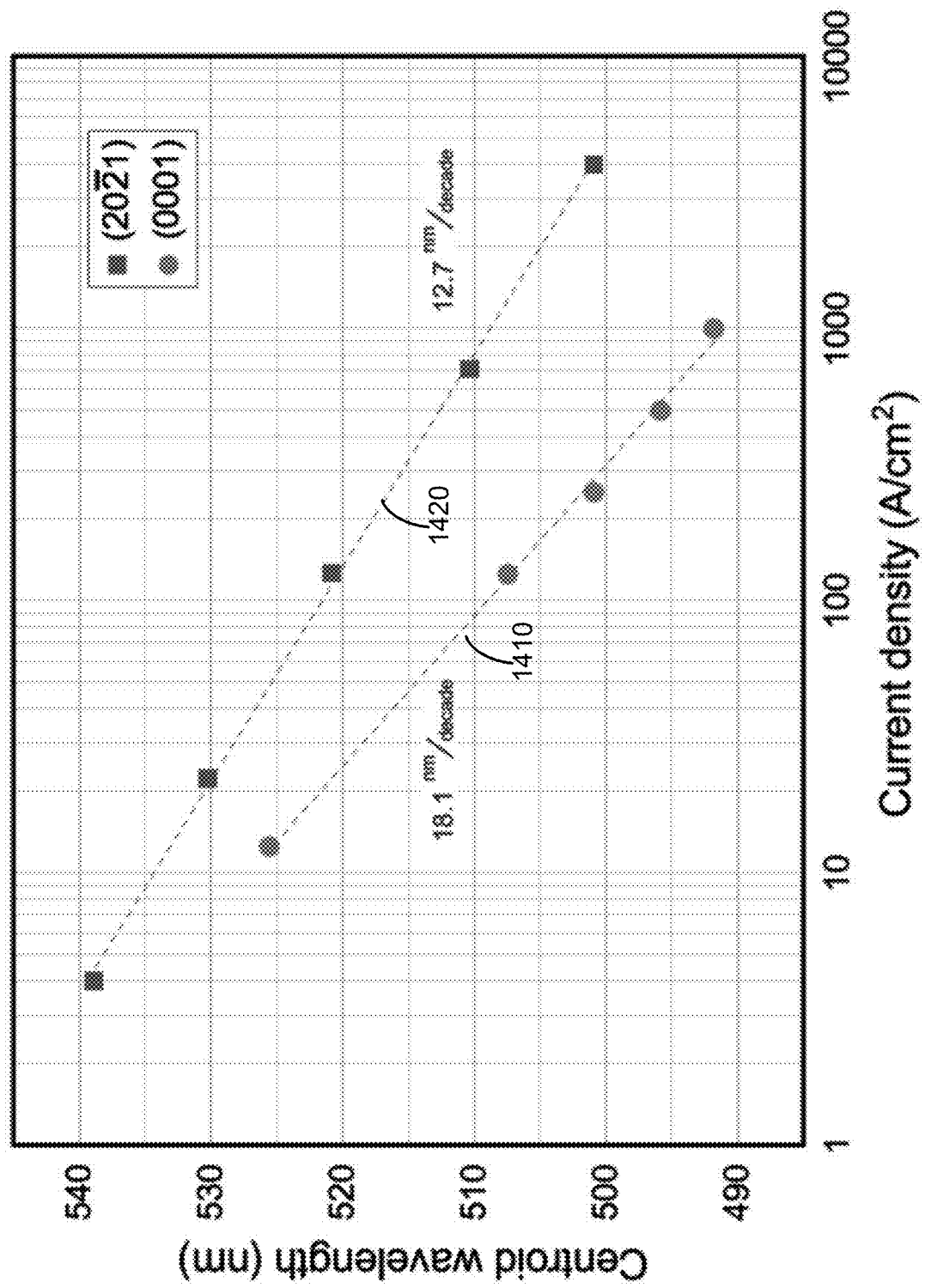
FIG. 14 illustrates the relationship between the wavelength of the emitted light and the current density for micro-LEDs including semiconductor materials with different crystal lattice orientations according to certain embodiments.

FIG. 14 illustrates the relationship between the center wavelength of the emitted light and the bias current density for semi-polar micro-LEDs including semiconductor materials with different crystal lattice orientations according to certain embodiments. A line 1410 shows the change in the center wavelength of the emitted green light with the change in bias current density for micro-LEDs grown on the (0001) plane of a substrate. Line 1410 shows that the center wavelength of the emitted green light changes with the bias current density at a rate of about −18 nm/decade. In other words, the center wavelength of the emitted green light decreases 18 nm when the bias current density increases 10 times. A line 1420 shows the change in the center wavelength of the emitted green light with the change in bias current density for micro-LEDs grown on the semi-polar (20 $\bar{2}$1) plane of a substrate. Line 1420 shows that the center wavelength of the emitted green light changes with the bias current density at a slower rate of about −12.7 nm/decade. Thus, FIG. 14 shows that the blue-shift can also be reduced by growing the LEDs on a semi-polar plane (e.g., (20$\bar{2}$1)

plane) of a substrate. In other words, the QCSE can be reduced by fabricating the LEDs on the semi-polar (20$\bar{2}$1) plane of a substrate.

IV. Example Method

Figure 15:
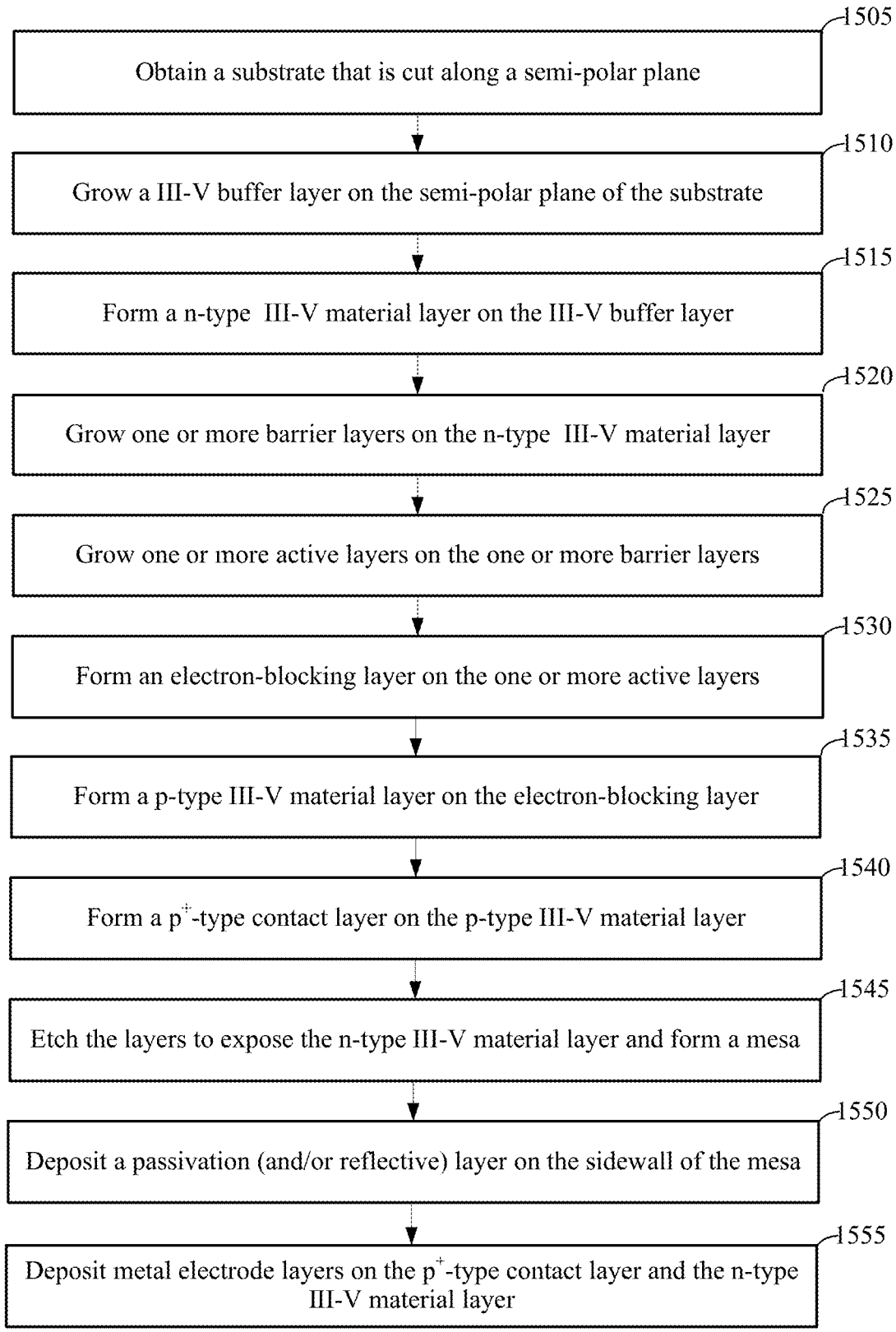
FIG. 15 is a flow chart illustrating an example of a method of fabricating a micro-LED device according to certain embodiments.

FIG. 15 is a flow chart 1500 illustrating an example of a method of fabricating a micro-LED device with improved light emission efficiency according to certain embodiments. The operations described in flow chart 1500 are for illustration purposes only and are not intended to be limiting. In various implementations, modifications may be made to flow chart 1500 to add additional operations or to omit some operations. The operations described in flow chart 1500 may be performed by, for example, one or more semiconductor fabrication systems that include, for example, molecular beam epitaxy (MBE) or metalorganic chemical vapor deposition (MOCVD) equipment.

At block 1505, a substrate, such as a sapphire substrate or a bulk III-V semiconductor substrate (e.g., GaN substrate) may be cut along a semi-polar plane (e.g., the (20$\bar{2}$1) plane). Thus, the exposed facet of the substrate (e.g., substrate 1010) may be a semi-polar plane, rather than the conventional c-plane. Optionally, at block 1510, a III-V buffer layer (e.g., buffer layer 1015) may be grown on the exposed semi-polar facet of the substrate. The buffer layer may be used to accommodate the differences in two crystallographic structures and to reduce misfit strain and misfit dislocations. One example of the buffer layer may include an undoped or unintentionally doped (UID) GaN layer. At block 1515, an n-type III-V material layer (e.g., n-GaN layer 1020) may be formed on the buffer layer. The n-type III-V material layer may be formed by growing a GaN layer and then doping the GaN layer with, for example, silicon or germanium. Optionally, at block 1520, one or more barrier layers (e.g., barrier layer 1025) may be formed on the n-type III-V material layer. The one or more barrier layers may include, for example, a superlattice structure. The superlattice structure may include a periodic structure of layers of two or more materials, such as InGaN and GaN, where the thickness of each layer may be several nanometers.

At block 1525, one or more active layers (e.g., active layer 1030) may be formed on the one or more barrier layers. The one or more active layers may include one or more quantum wells, such as a MQW including multiple (e.g., about 2 to 6) quantum wells. In one example, the one or more active layer includes an InGaN/GaN MQW that can generate green or blue light. Optionally, at block 1530, an electron-blocking layer (e.g., electron-blocking layer 1035) may be formed on the one or more active layers to reduce the electron leakage current and improve the efficiency of the LED. In one example, the electron-blocking layer may include an AlGaN layer. At block 1535, a p-type III-V material layer (e.g., p-GaN layer 1040) may be formed on the electron-blocking layer by, for example, growing a GaN layer and doping the GaN layer with, for example, Mg, Mg, Ca, Zn, or Be. At block 1540, a $p^+$-type or $p^{++}$-type contact layer (e.g., $p^+$-GaN layer 1045) may be formed on the p-type III-V material layer to reduce the contact resistance. The $p^+$-type or $p^{++}$-type contact layer may include, for example, a GaN layer heavily doped with Mg. Optionally, a conductor layer (conductor layer 1050), such as a transparent ITO layer, may be deposited on the $p^+$-type or $p^{++}$-type contact layer.

At block 1545, the layer stack that includes, for example, the barrier layer, the active layer(s), the electron-blocking layer, the p-type III-V material layer, the $p^+$-type contact layer, the conductor layer, and, in some embodiments, a portion of the n-type III-V material layer, may be etched to form a mesa structure, such as a vertical mesa structure. The mesa structure may include sidewalls (e.g., sidewalls 1032 and 1034). At block 1550, a passivation and/or reflection layer may be deposited on the sidewalls of the mesa structure. The passivation layer may include, for example, a $SiO_2$, $SiN_x$, or $Al_2O_3$ layer. In some embodiments, at least some portions of the sidewalls may be coated with an omnidirectional reflector (ODR) that includes, for example, $Ta_2O_5$ and/or $SiO_2$. The passivation and/or reflection layer may help to reflect the photons emitted by the active layers out of the LED to improve the extraction efficiency of the LED. In some embodiments, before forming the passivation and/or reflection layer, the sidewalls of the mesa structure may be chemically etched to remove the defects at the sidewalls due to physical etching. At block 1555, metal electrode layers (e.g., electrode layers 1070 and 1080) may be deposited on the n-type III-V material layer and the p+-type contact layer (or the conductor layer), respectively. The metal electrode layers may include, for example, Al, Ni, Au, or any combination thereof.

It is noted that even though only one mesa structure (and one micro-LED) is described with respect to FIG. 15, in some embodiments, at block 1545, many mesa structures, such as a one-dimensional or two-dimensional array of mesa structures, may be etched on a same die or a same wafer that has the layers of III-V materials grown on a same substrate. The passivation and/or reflection layer may be deposited on the sidewalls of the array of mesa structures at block 1550. A metal electrode layer may be deposited on the $p^+$-type contact layer of each of the array of mesa structures to form an electrode (e.g., anode) for each of an array of micro-LEDs at block 1555. In some embodiments, the array of micro-LEDs may share a same metal contact (e.g., a shared cathode) on the n-type III-V material layer, and can be individually addressed through the respective anode. The array of micro-LEDs fabricated on the same die or same wafer may have similar characteristics and performance, and thus a better uniformity among the array of micro-LEDs.

V. Example System

Embodiments of the invention may be used to implement components of an artificial reality system or may be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 16:
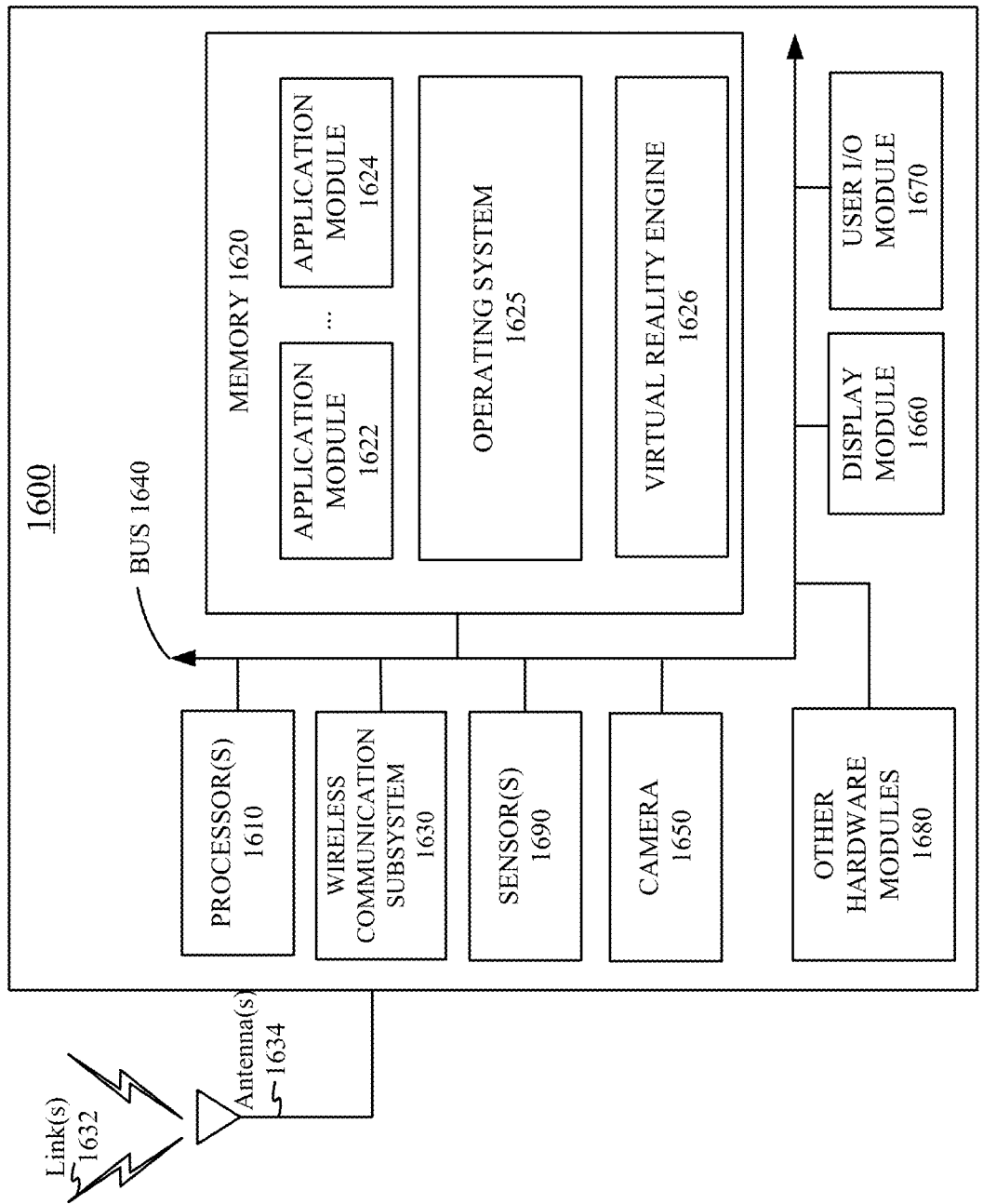
FIG. 16 is a simplified block diagram of an electronic system of an example of a near-eye display according to certain embodiments.

FIG. 16 is a simplified block diagram of an example electronic system 1600 of an example near-eye display (e.g., HMD device) for implementing some of the examples disclosed herein. Electronic system 1600 may be used as the electronic system of an HMD device or other near-eye displays described above. In this example, electronic system 1600 may include one or more processor(s) 1610 and a memory 1620. Processor(s) 1610 may be configured to execute instructions for performing operations at a number of components, and can be, for example, a general-purpose processor or microprocessor suitable for implementation within a portable electronic device. Processor(s) 1610 may be communicatively coupled with a plurality of components within electronic system 1600. To realize this communicative coupling, processor(s) 1610 may communicate with the other illustrated components across a bus 1640. Bus 1640 may be any subsystem adapted to transfer data within electronic system 1600. Bus 1640 may include a plurality of computer buses and additional circuitry to transfer data.

Memory 1620 may be coupled to processor(s) 1610. In some embodiments, memory 1620 may offer both short-term and long-term storage and may be divided into several units. Memory 1620 may be volatile, such as static random access memory (SRAM) and/or dynamic random access memory (DRAM) and/or non-volatile, such as read-only memory (ROM), flash memory, and the like. Furthermore, memory 1620 may include removable storage devices, such as secure digital (SD) cards. Memory 1620 may provide storage of computer-readable instructions, data structures, program modules, and other data for electronic system 1600. In some embodiments, memory 1620 may be distributed into different hardware modules. A set of instructions and/or code might be stored on memory 1620. The instructions might take the form of executable code that may be executable by electronic system 1600, and/or might take the form of source and/or installable code, which, upon compilation and/or installation on electronic system 1600 (e.g., using any of a variety of generally available compilers, installation programs, compression/decompression utilities, etc.), may take the form of executable code.

In some embodiments, memory 1620 may store a plurality of application modules 1622 through 1624, which may include any number of applications. Examples of applications may include gaming applications, conferencing applications, video playback applications, or other suitable applications. The applications may include a depth sensing function or eye tracking function. Application modules 1622-1624 may include particular instructions to be executed by processor(s) 1610. In some embodiments, certain applications or parts of application modules 1622-1624 may be executable by other hardware modules 1680. In certain embodiments, memory 1620 may additionally include secure memory, which may include additional security controls to prevent copying or other unauthorized access to secure information.

In some embodiments, memory 1620 may include an operating system 1625 loaded therein. Operating system 1625 may be operable to initiate the execution of the instructions provided by application modules 1622-1624 and/or manage other hardware modules 1680 as well as interfaces with a wireless communication subsystem 1630 which may include one or more wireless transceivers. Operating system 1625 may be adapted to perform other operations across the components of electronic system 1600 including threading, resource management, data storage control and other similar functionality.

Wireless communication subsystem 1630 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1600 may include one or more antennas 1634 for wireless communication as part of wireless communication subsystem 1630 or as a separate component coupled to any portion of the system. Depending on desired functionality, wireless communication subsystem 1630 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15×, or some other types of network. The techniques described herein may also be used for any combination of WWAN, WLAN, and/or WPAN. Wireless communications subsystem 1630 may permit data to be exchanged with a network, other computer systems, and/or any other devices described herein. Wireless communication subsystem 1630 may include a means for transmitting or receiving data, such as identifiers of HMD devices, position data, a geographic map, a heat map, photos, or videos, using antenna(s) 1634 and wireless link(s) 1632. Wireless communication subsystem 1630, processor (s) 1610, and memory 1620 may together comprise at least a part of one or more of a means for performing some functions disclosed herein.

Embodiments of electronic system 1600 may also include one or more sensors 1690. Sensor(s) 1690 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1690 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1600 may include a display module 1660. Display module 1660 may be a near-eye display, and may graphically present information, such as images, videos, and various instructions, from electronic system 1600 to a user. Such information may be derived from one or more application modules 1622-1624, virtual reality engine 1626, one or more other hardware modules 1680, a combination thereof, or any other suitable means for resolving graphical content for the user (e.g., by operating system 1625). Display module 1660 may use liquid crystal display (LCD) technology, light-emitting diode (LED) technology (including, for example, OLED, ILED, μ-LED, AMOLED, TOLED, etc.), light emitting polymer display (LPD) technology, or some other display technology. Despite Electronic system 1600 may include a user input/output module 1670. User input/output module 1670 may allow a user to send action requests to electronic system 1600. An action request may be a request to perform a particular action. For example, an action request may be to start or end an application or to perform a particular action within the application. User input/output module 1670 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1600. In some embodiments, user input/output module 1670 may provide haptic feedback to the user in accordance with instructions received from electronic system 1600. For example, the haptic feedback may be provided when an action request is received or has been performed.

Electronic system 1600 may include a camera 1650 that may be used to take photos or videos of a user, for example, for tracking the user's eye position. Camera 1650 may also be used to take photos or videos of the environment, for example, for VR, AR, or MR applications. Camera 1650 may include, for example, a complementary metal-oxide-semiconductor (CMOS) image sensor with a few millions or tens of millions of pixels. In some implementations, camera 1650 may include two or more cameras that may be used to capture 3-D images.

In some embodiments, electronic system 1600 may include a plurality of other hardware modules 1680. Each of other hardware modules 1680 may be a physical module within electronic system 1600. While each of other hardware modules 1680 may be permanently configured as a structure, some of other hardware modules 1680 may be temporarily configured to perform specific functions or temporarily activated. Examples of other hardware modules 1680 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1680 may be implemented in software.

In some embodiments, memory 1620 of electronic system 1600 may also store a virtual reality engine 1626. Virtual reality engine 1626 may execute applications within electronic system 1600 and receive position information, acceleration information, velocity information, predicted future positions, or some combination thereof of the HMD device from the various sensors. In some embodiments, the information received by virtual reality engine 1626 may be used for producing a signal (e.g., display instructions) to display module 1660. For example, if the received information indicates that the user has looked to the left, virtual reality engine 1626 may generate content for the HMD device that mirrors the user's movement in a virtual environment. Additionally, virtual reality engine 1626 may perform an action within an application in response to an action request received from user input/output module 1670 and provide feedback to the user. The provided feedback may be visual, audible, or haptic feedback. In some implementations, processor(s) 1610 may include one or more GPUs that may execute virtual reality engine 1626.

In various implementations, the above-described hardware and modules may be implemented on a single device or on multiple devices that can communicate with one another using wired or wireless connections. For example, in some implementations, some components or modules, such as GPUs, virtual reality engine 1626, and applications (e.g., tracking application), may be implemented on a console separate from the head-mounted display device. In some implementations, one console may be connected to or support more than one HMD.

In alternative configurations, different and/or additional components may be included in electronic system 1600. Similarly, functionality of one or more of the components can be distributed among the components in a manner different from the manner described above. For example, in some embodiments, electronic system 1600 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A micro light emitting diode comprising:
   a substrate including a hexagonal lattice and having a top surface parallel to a semi-polar plane of the hexagonal lattice; and
   a mesa on the top surface of the substrate, the mesa including a sidewall and an active layer that includes a III-nitride material, the active layer including:
      a side surface forming part of the sidewall of the mesa; and
      a bottom surface parallel to the semi-polar plane of the hexagonal lattice such that non-radiative surface recombination at the side surface of the active layer is reduced compared with a substitute active layer that includes the III-nitride material and has a top or bottom surface parallel to a c-plane of the hexagonal lattice,
   wherein:
      an angle between the semi-polar plane and the c-plane of the hexagonal lattice is between 60° and 90°;
      the bottom surface of the active layer in the mesa is characterized by a linear dimension less than 20 µm; and
   a peak efficiency current density of the micro light emitting diode is less than 1 A/cm$^2$.

2. The micro light emitting diode of claim 1, wherein the semi-polar plane includes a (20$\bar{2}$1) plane of the hexagonal lattice.

3. The micro light emitting diode of claim 1, wherein:
   the active layer is characterized by a first Shockley-Read-Hall (SRH) recombination rate in a region of the active layer adjacent to the side surface of the active layer; and
   the first SRH recombination rate is lower than a second SRH recombination rate, wherein the second SRH recombination rate corresponds to an SRH recombination rate in the region of the active layer adjacent to the side surface of the active layer when the bottom surface of the active layer is parallel to the c-plane of the hexagonal lattice.

4. The micro light emitting diode of claim 3, wherein the region of the active layer adjacent to the side surface of the active layer is within a minority carrier diffusion length from the side surface of the active layer.

5. The micro light emitting diode of claim 1, further comprising a passivation layer on the sidewall of the mesa, wherein:
the active layer is configured to emit photons through radiative recombination of electrons and holes in the active layer; and
the passivation layer is configured to reflect the photons emitted by the active layer.

6. The micro light emitting diode of claim 5, wherein at least a portion of the passivation layer includes an omnidirectional reflector.

7. The micro light emitting diode of claim 1, wherein the substrate includes GaN, GaAs, GaP, sapphire, silicon carbide, silicon, zinc oxide, boron nitride, lithium aluminate, lithium niobate, germanium, aluminum nitride, lithium gallate, partially substituted spinel, or quaternary tetragonal oxide having a beta-LiAlO$_2$ structure.

8. The micro light emitting diode of claim 1, wherein the active layer includes an InGaN multiple-quantum-well (MQW).

9. The micro light emitting diode of claim 1, wherein a blue-shift of the micro light emitting diode is less than 15 nm when a current density of the micro light emitting diode is increased ten times.

10. The micro light emitting diode of claim 1, further comprising a buffer layer between the substrate and the mesa.

11. The micro light emitting diode of claim 1, wherein the mesa further includes an electron-blocking layer coupled to the active layer.

12. A display device comprising:
a substrate including a hexagonal lattice and a top surface parallel to a semi-polar plane of the hexagonal lattice; and
an array of mesas on the top surface of the substrate, each mesa including a sidewall and an active layer that includes a III-nitride material, the active layer including:
a side surface forming part of the sidewall of the mesa; and
a bottom surface parallel to the semi-polar plane of the hexagonal lattice such that non-radiative surface recombination at the side surface of the active layer is reduced compared with a substitute active layer that includes the III-nitride material and has a top or bottom surface parallel to a c-plane of the hexagonal lattice,
wherein:
an angle between the semi-polar plane and the c-plane of the hexagonal lattice is between 60° and 90°;
the bottom surface of the active layer in the mesa is characterized by a linear dimension less than 20 μm; and
a peak efficiency current density of the mesa is less than 1 A/cm$^2$.

13. The display device of claim 12, further comprising a passivation layer on the sidewall of each mesa in the array of mesas, the passivation layer configured to reflect photons emitted by the active layer.

14. The display device of claim 13, wherein at least a portion of the passivation layer includes an omnidirectional reflector.

15. The display device of claim 12, wherein the semi-polar plane includes a $(20\bar{2}1)$ plane of the hexagonal lattice.

16. The display device of claim 12, wherein the substrate includes GaN, GaAs, GaP, sapphire, silicon carbide, silicon, zinc oxide, boron nitride, lithium aluminate, lithium niobate, germanium, aluminum nitride, lithium gallate, partially substituted spinel, or quaternary tetragonal oxide having a beta-LiAlO$_2$ structure.

17. The display device of claim 12, wherein the active layer includes an InGaN multiple-quantum-well (MQW).

18. The display device of claim 12, wherein a blue-shift of the mesa is less than 15 nm when a current density of the mesa is increased ten times.

19. The display device of claim 12, further comprising a buffer layer between the substrate and the mesa.

20. The display device of claim 12, wherein the mesa further includes an electron-blocking layer coupled to the active layer.

* * * * *